United States Patent
Negishi et al.

(10) Patent No.: US 11,690,293 B2
(45) Date of Patent: Jun. 27, 2023

(54) PHOTOELECTRIC CONVERSION ELEMENT AND SOLID-STATE IMAGING DEVICE

(71) Applicant: SONY SEMICONDUCTOR SOLUTIONS CORPORATION, Kanagawa (JP)

(72) Inventors: Yuki Negishi, Kanagawa (JP); Osamu Enoki, Kanagawa (JP); Yuta Hasegawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 415 days.

(21) Appl. No.: 16/645,038

(22) PCT Filed: Aug. 17, 2018

(86) PCT No.: PCT/JP2018/030548
§ 371 (c)(1),
(2) Date: Mar. 6, 2020

(87) PCT Pub. No.: WO2019/054125
PCT Pub. Date: Mar. 21, 2019

(65) Prior Publication Data
US 2021/0119149 A1    Apr. 22, 2021

(30) Foreign Application Priority Data

Sep. 15, 2017 (JP) .................. 2017-177775
Apr. 20, 2018 (JP) .................. 2018-081098

(51) Int. Cl.
| | |
|---|---|
| H01L 51/00 | (2006.01) |
| H10K 85/60 | (2023.01) |
| H10K 19/20 | (2023.01) |
| H10K 30/30 | (2023.01) |
| H10K 39/32 | (2023.01) |

(Continued)

(52) U.S. Cl.
CPC ......... H10K 85/6576 (2023.02); H10K 19/20 (2023.02); H10K 30/30 (2023.02);
(Continued)

(58) Field of Classification Search
CPC . H01L 51/0074; H01L 27/286; H01L 27/307; H01L 51/0046; H01L 51/0047;
(Continued)

(56) References Cited

U.S. PATENT DOCUMENTS

| | | | |
|---|---|---|---|
| 2011/0210319 A1* | 9/2011 | Nakano | .................. C07C 22/08 549/41 |
| 2018/0159053 A1* | 6/2018 | Koyanagi | ............... C09B 57/00 |

FOREIGN PATENT DOCUMENTS

| | | |
|---|---|---|
| CN | 102137831 A | 7/2011 |
| JP | 2014-078729 A | 5/2014 |

(Continued)

OTHER PUBLICATIONS

International Search Report and Written Opinion of PCT Application No. PCT/JP2018/030548, dated Sep. 11, 2018, 11 pages of ISRWO.

Primary Examiner — Ermias T Woldegeorgis
(74) Attorney, Agent, or Firm — Chip Law Group

(57) ABSTRACT

A photoelectric conversion element of the present disclosure includes a first electrode, a second electrode disposed to be opposed to the first electrode, and an organic photoelectric conversion layer provided between the first electrode and the second electrode and including at least one of a Chryseno [1,2-b:8,7-b']dithiophene (ChDT1) derivative represented by the general formula (1) or a Chryseno[1,2-b:7,8-b'] dithiophene (ChDT2) derivative represented by the general formula (2).

11 Claims, 17 Drawing Sheets

(51) Int. Cl.
  *H10K 85/20*  (2023.01)
  *H10K 85/30*  (2023.01)
  *H01L 27/146*  (2006.01)

(52) U.S. Cl.
  CPC ........... *H10K 39/32* (2023.02); *H10K 85/211* (2023.02); *H10K 85/215* (2023.02); *H10K 85/311* (2023.02); *H10K 85/654* (2023.02); *H10K 85/655* (2023.02); *H01L 27/14647* (2013.01)

(58) Field of Classification Search
  CPC ............. H01L 51/0067; H01L 51/0068; H01L 51/0078; H01L 51/4253; H01L 27/14647; H01L 27/14621; H01L 27/14625; H01L 27/14636; Y02E 10/549
  See application file for complete search history.

(56) References Cited

FOREIGN PATENT DOCUMENTS

| | | | | |
|---|---|---|---|---|
| JP | 2015-233117 A | | 12/2015 | |
| JP | 2017-157801 A | | 9/2017 | |
| JP | 2017157801 A | * | 9/2017 | |
| KR | 10-2011-0058787 A | | 6/2011 | |
| TW | 201016637 A | | 5/2010 | |
| TW | 201710267 A | | 3/2017 | |
| WO | 2010/024388 A1 | | 3/2010 | |
| WO | 2016/203925 A1 | | 12/2016 | |
| WO | 2017/022761 A1 | | 2/2017 | |
| WO | WO-2017022761 A | * | 2/2017 | ............ C07F 7/0812 |
| WO | WO-2017022761 A1 | * | 2/2017 | ............ C07F 7/0812 |
| WO | 2017/170279 A1 | | 10/2017 | |

* cited by examiner

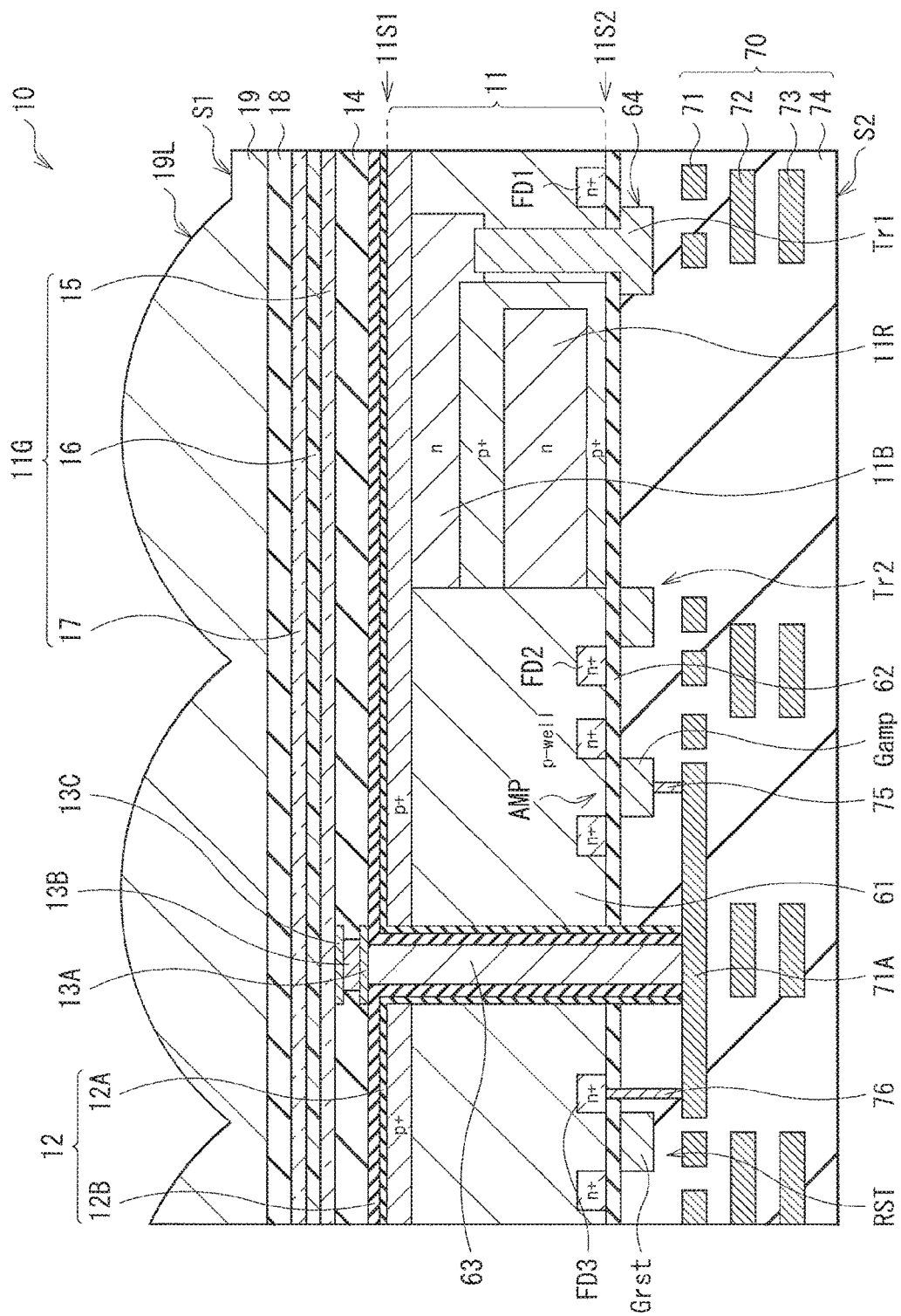
[FIG. 1]

[FIG. 2]
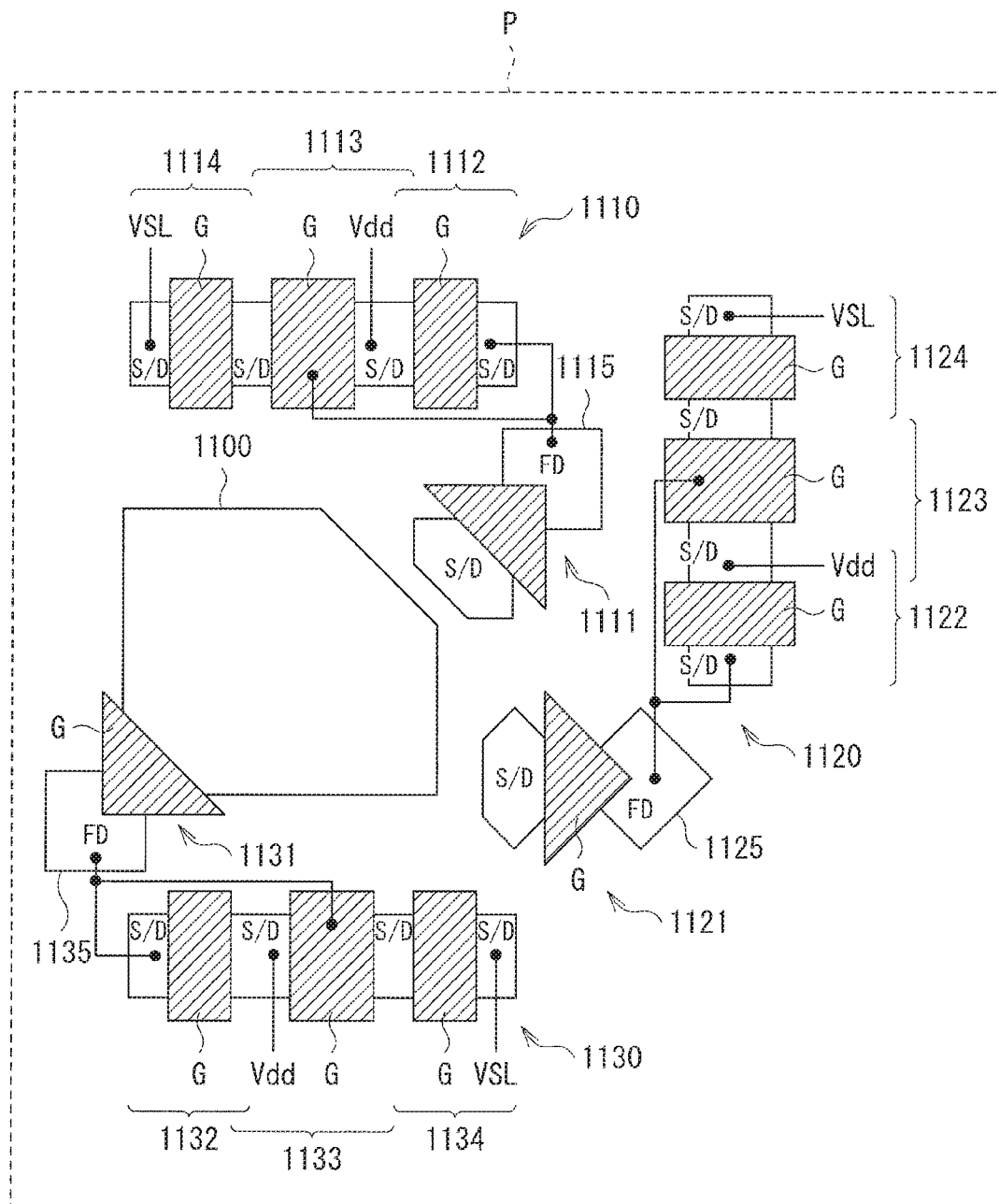

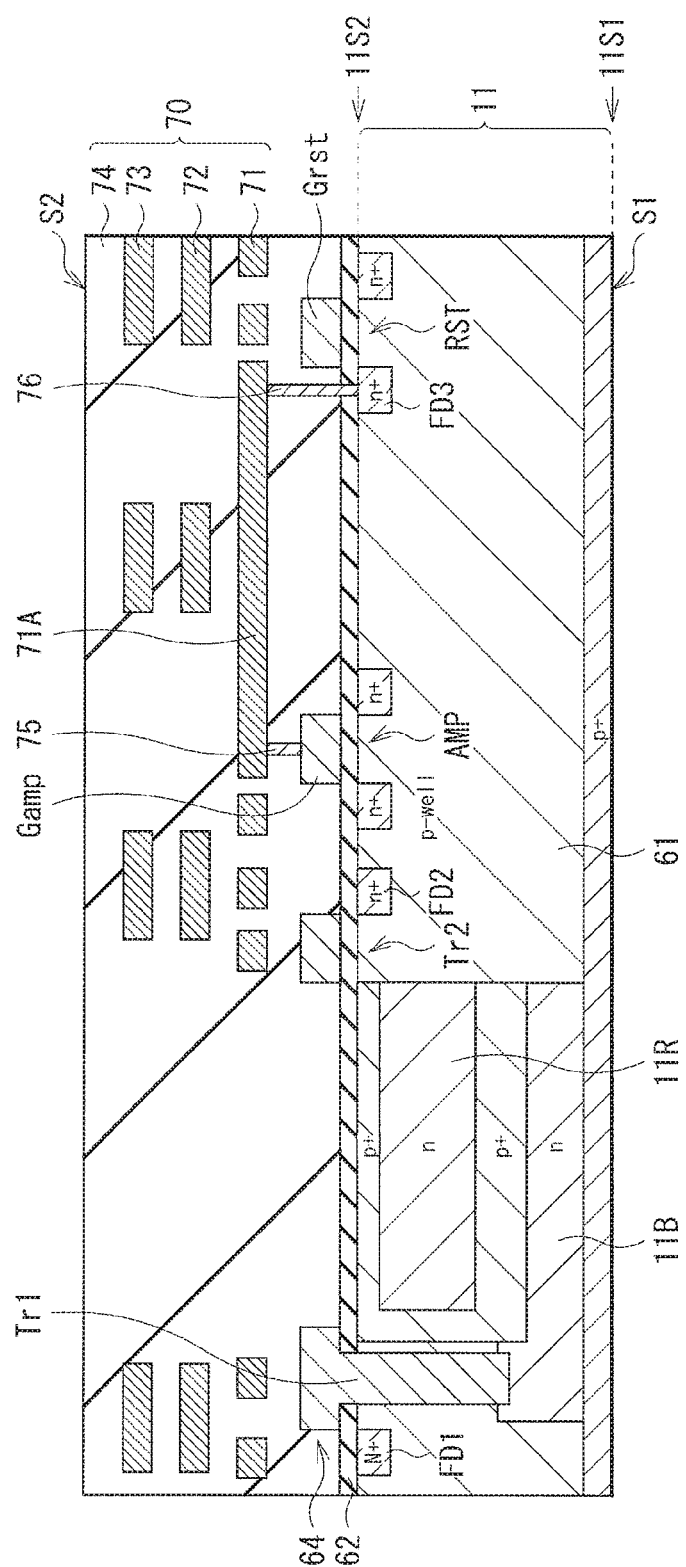
[FIG. 3]

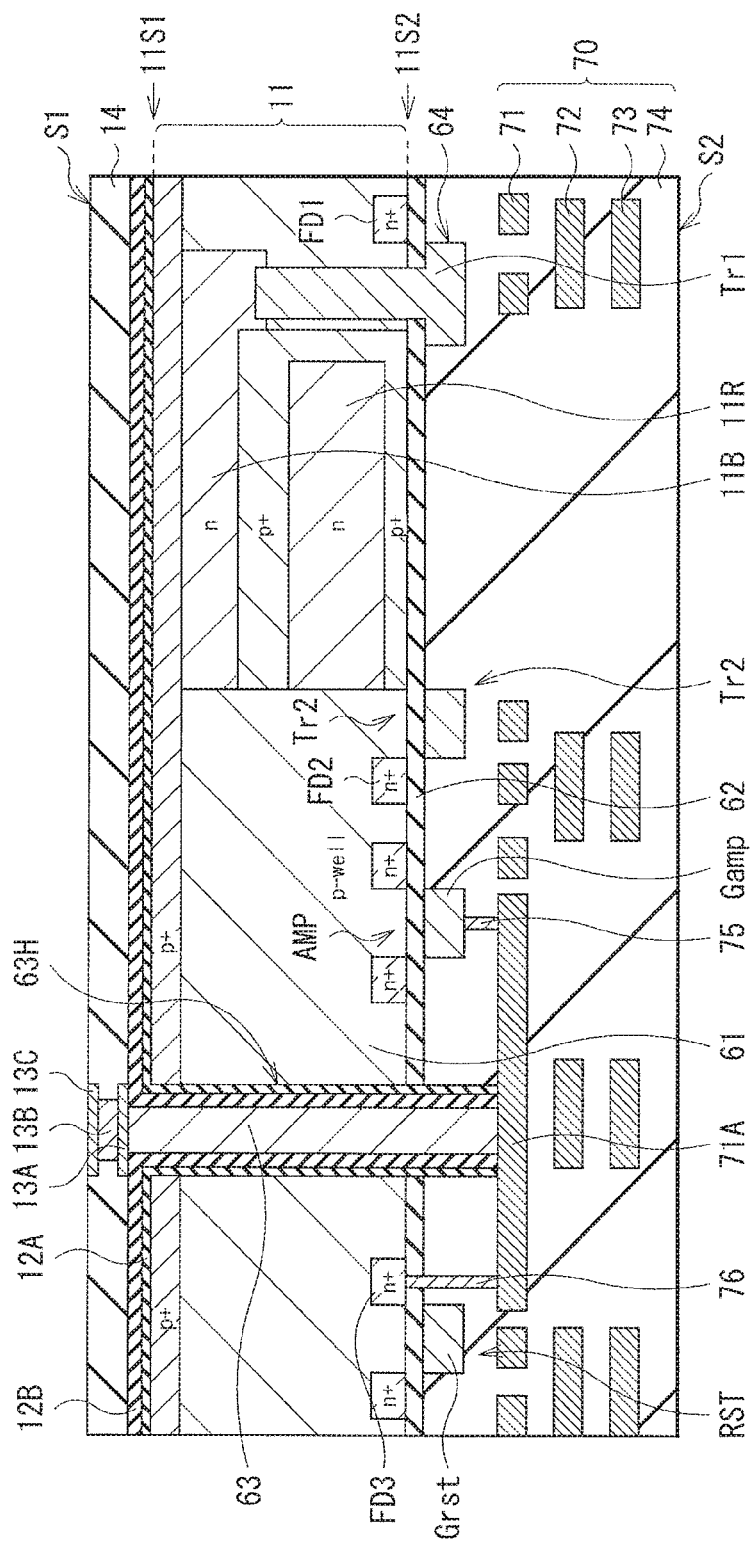
[FIG. 4]

[FIG. 5A]
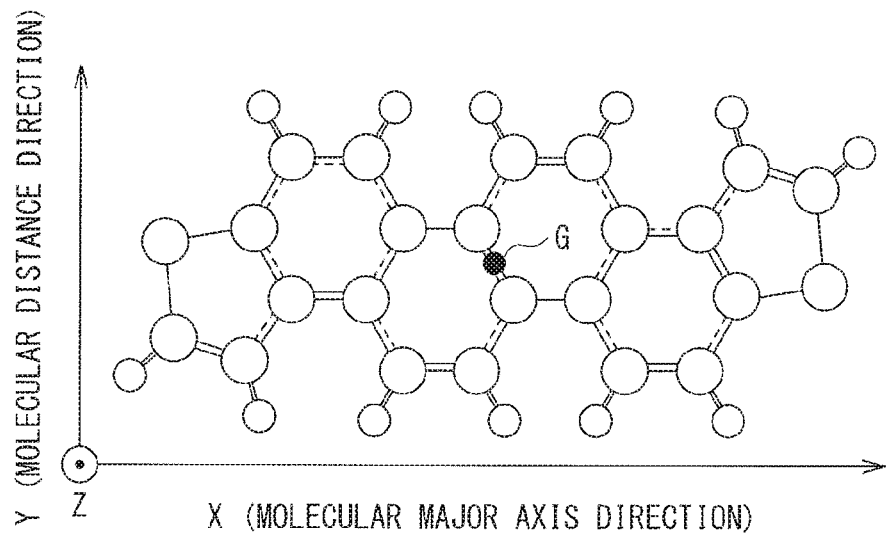
[FIG. 5B]
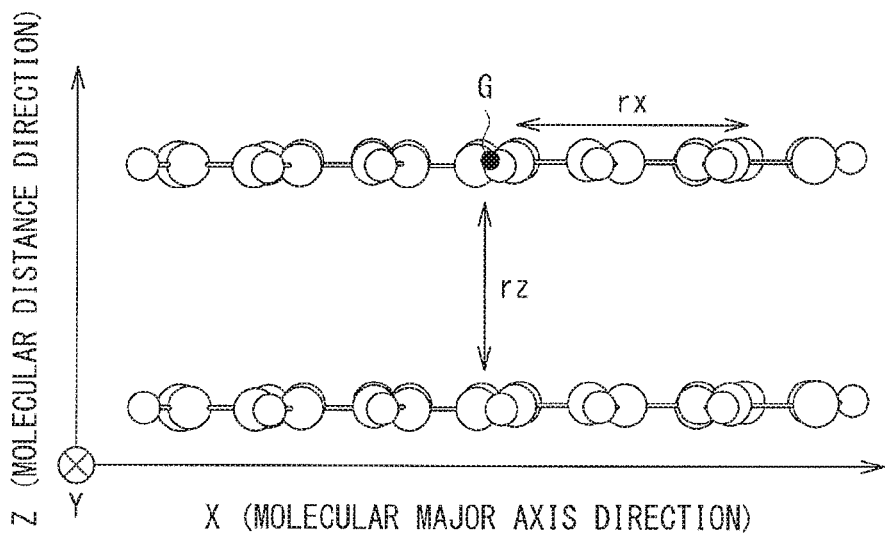

[FIG. 6]
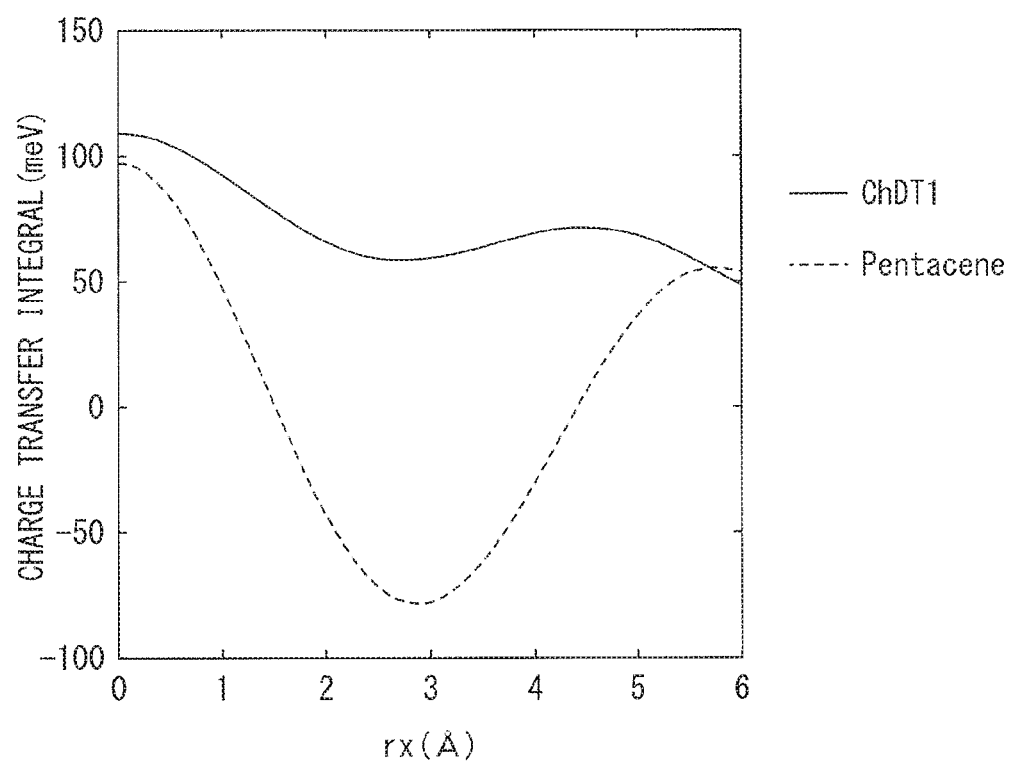

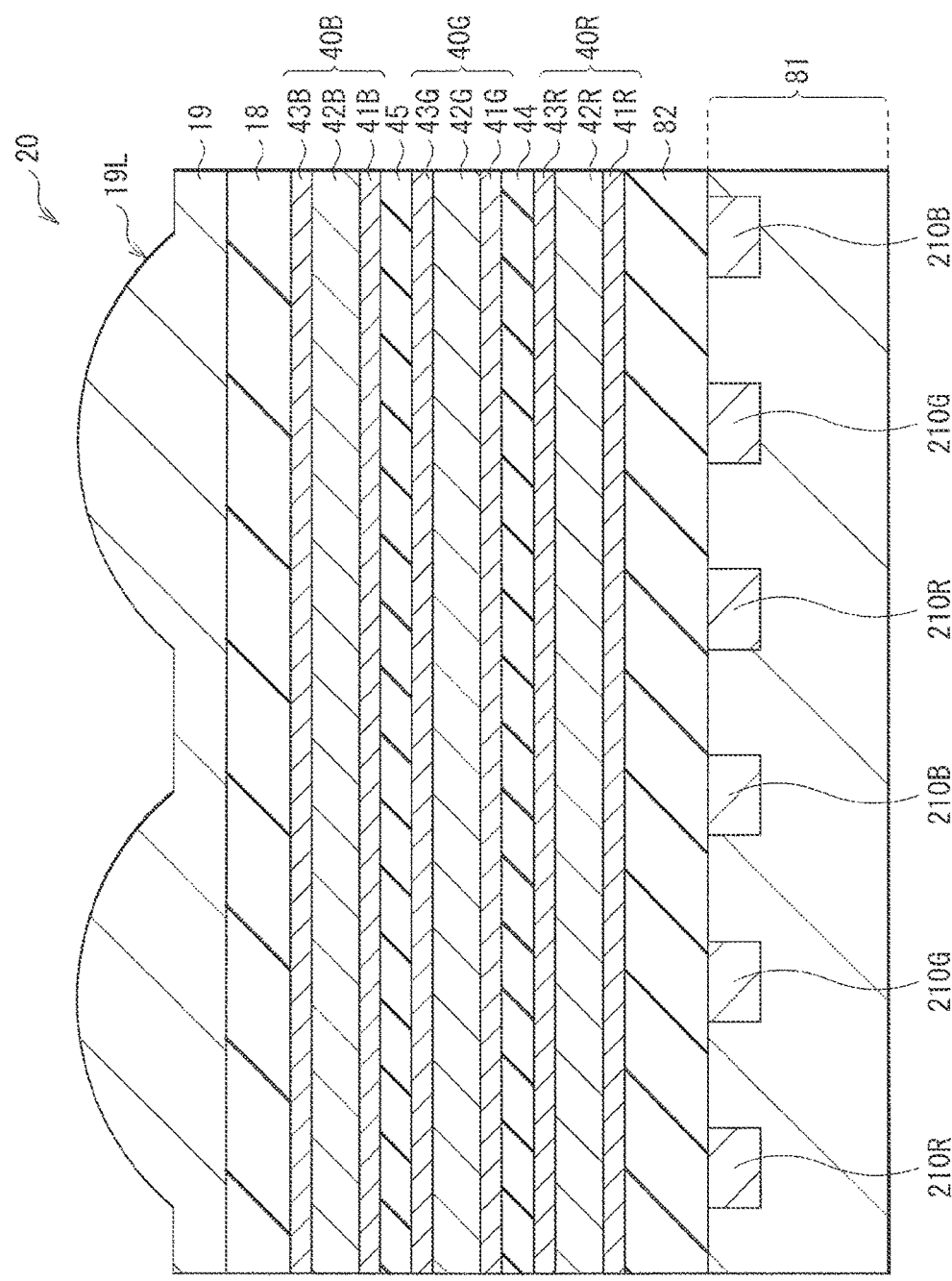

[FIG. 8]
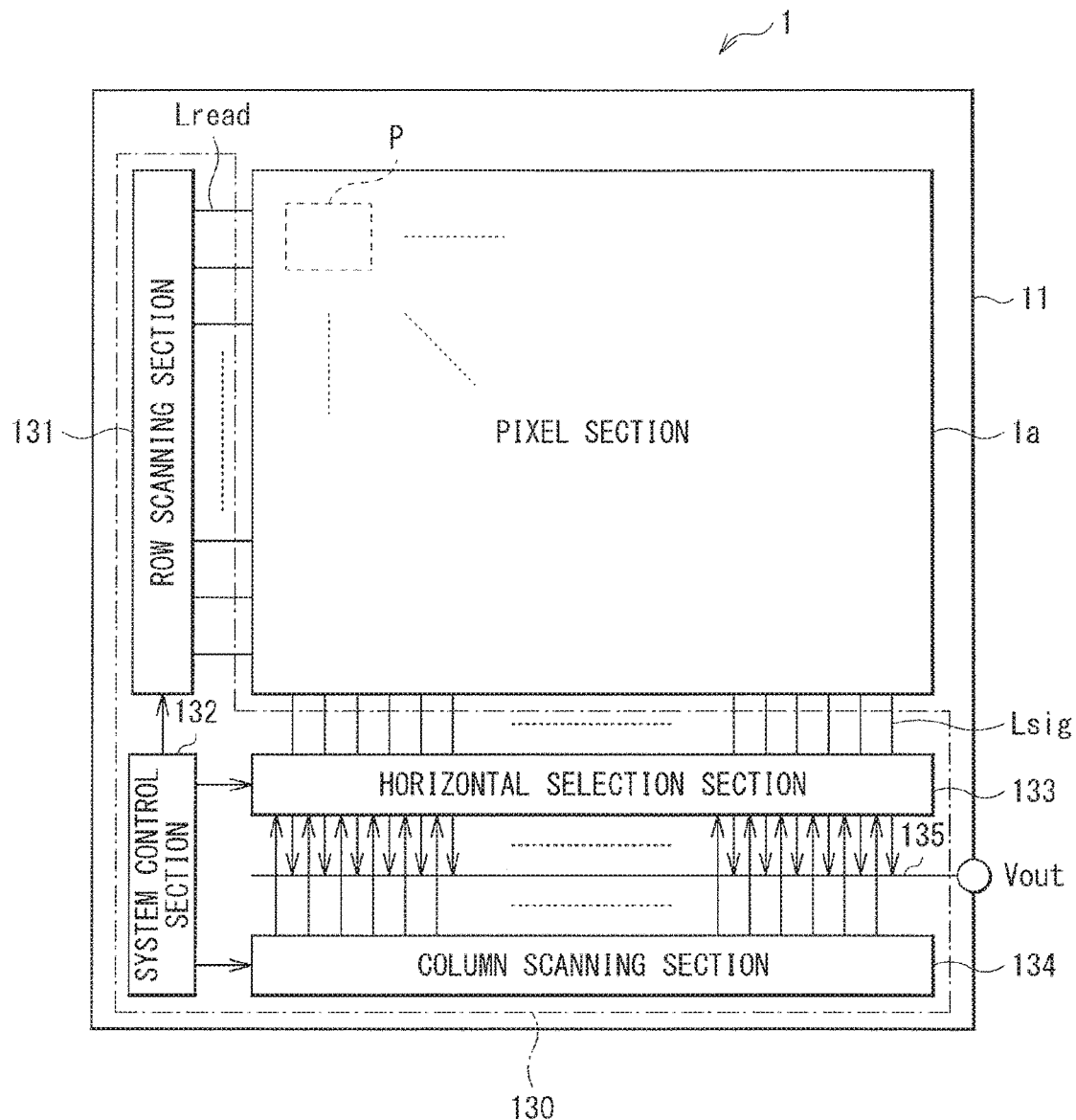

[FIG. 9]
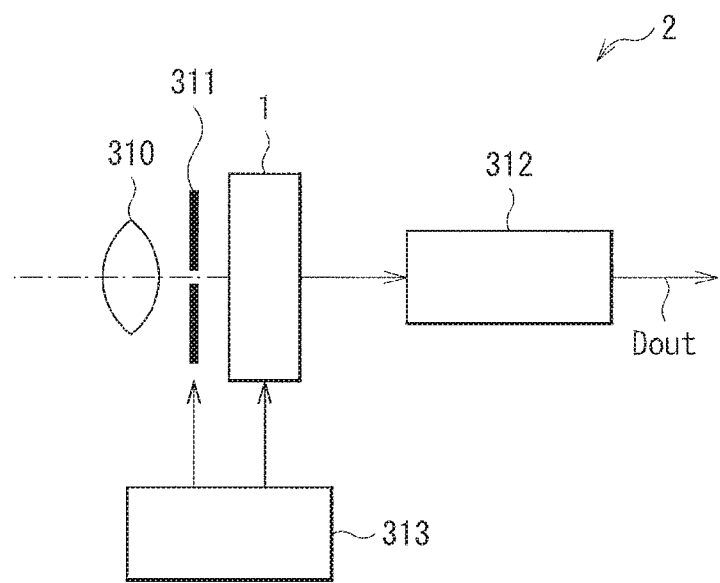

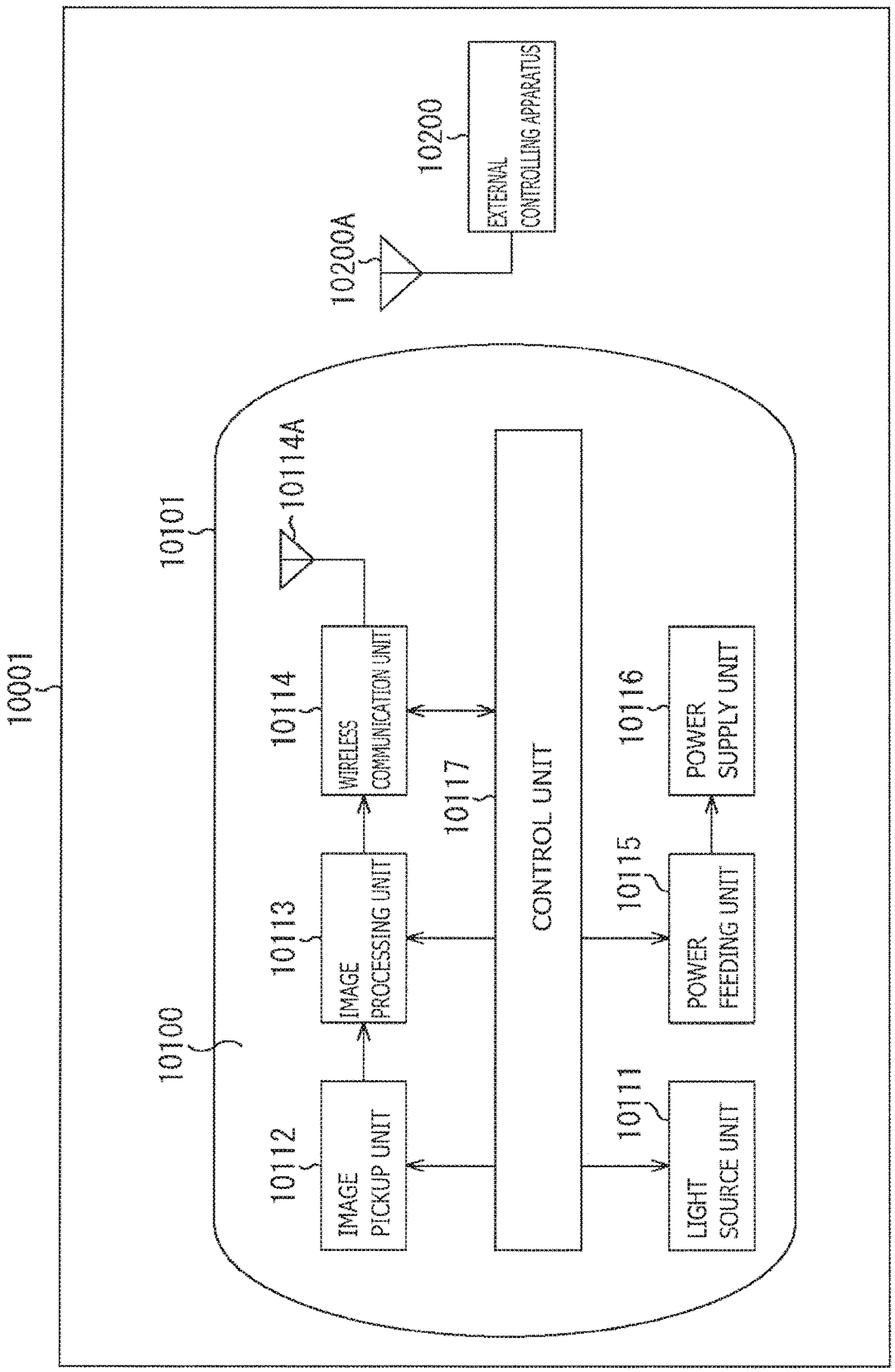
[FIG. 10]

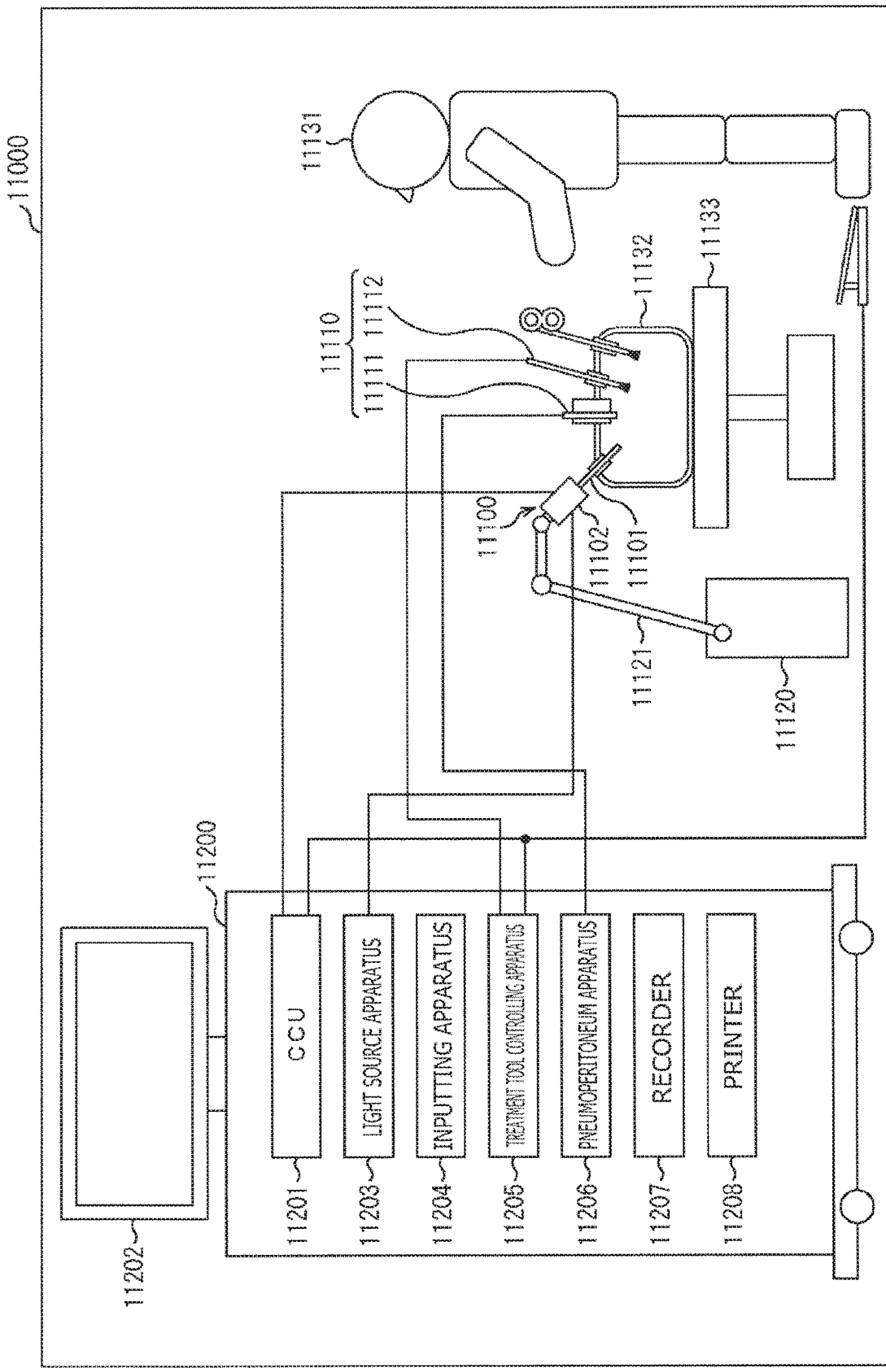
[FIG. 11]

[FIG. 12]
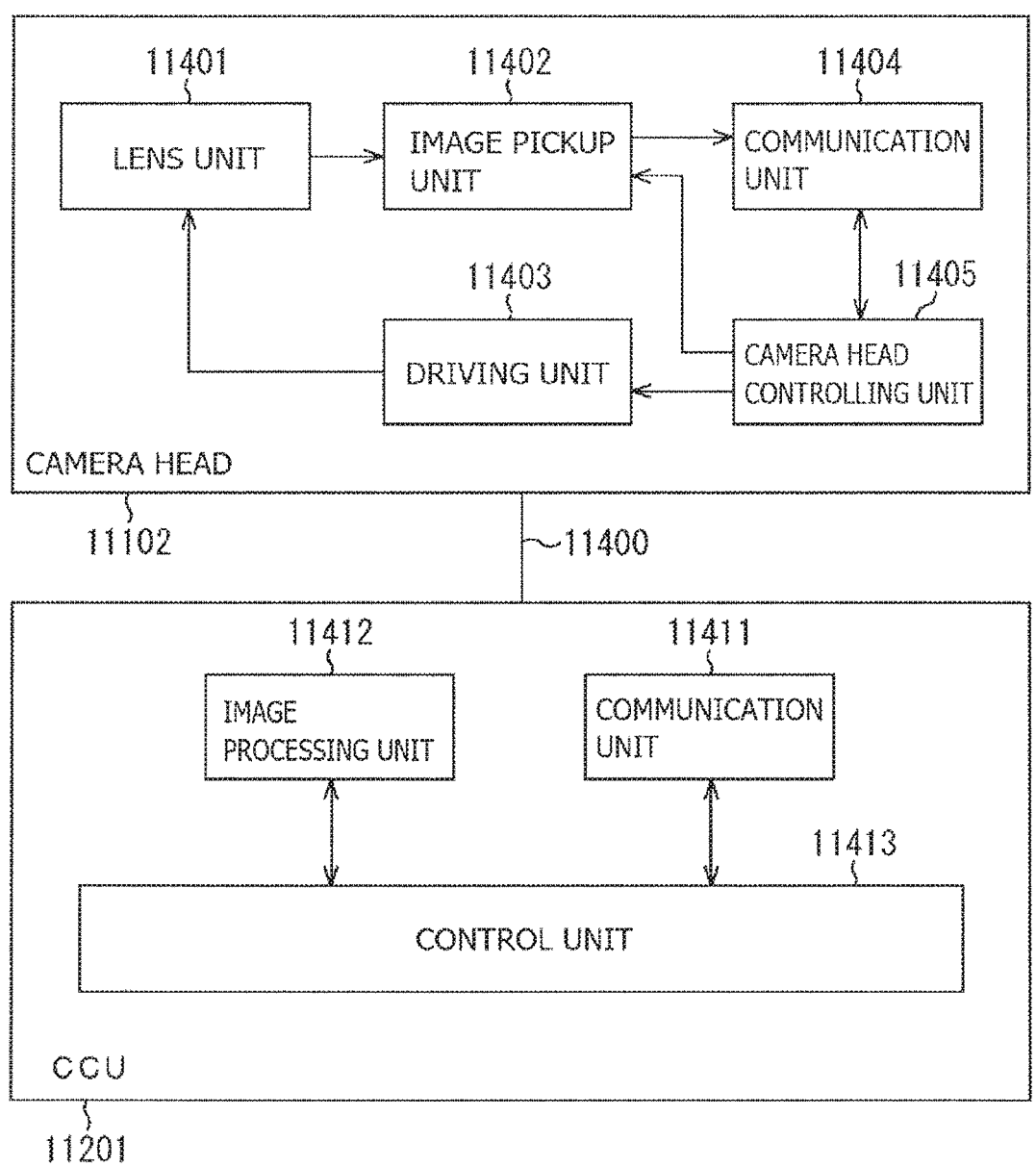

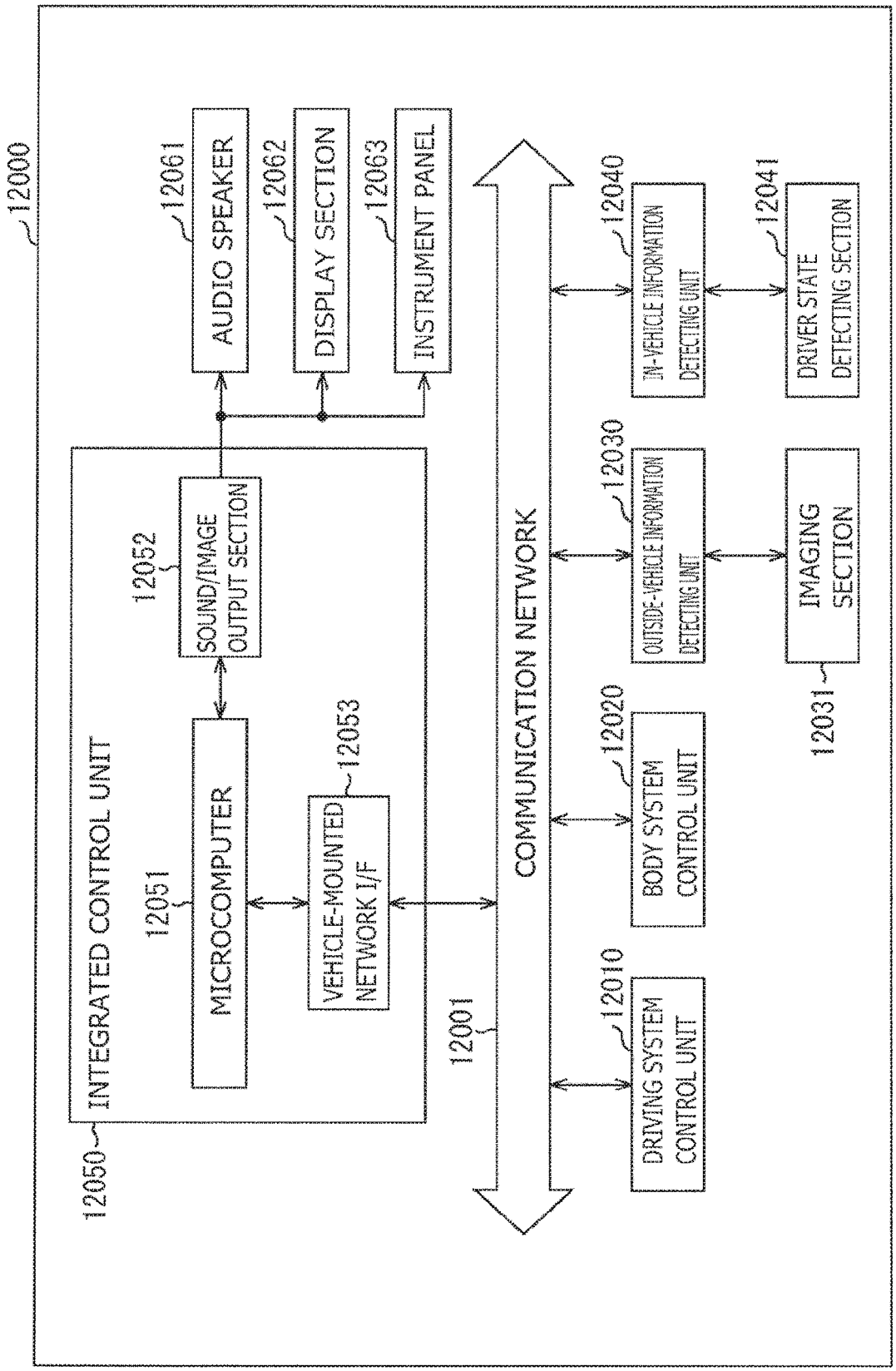
[FIG. 13]

[FIG. 14]
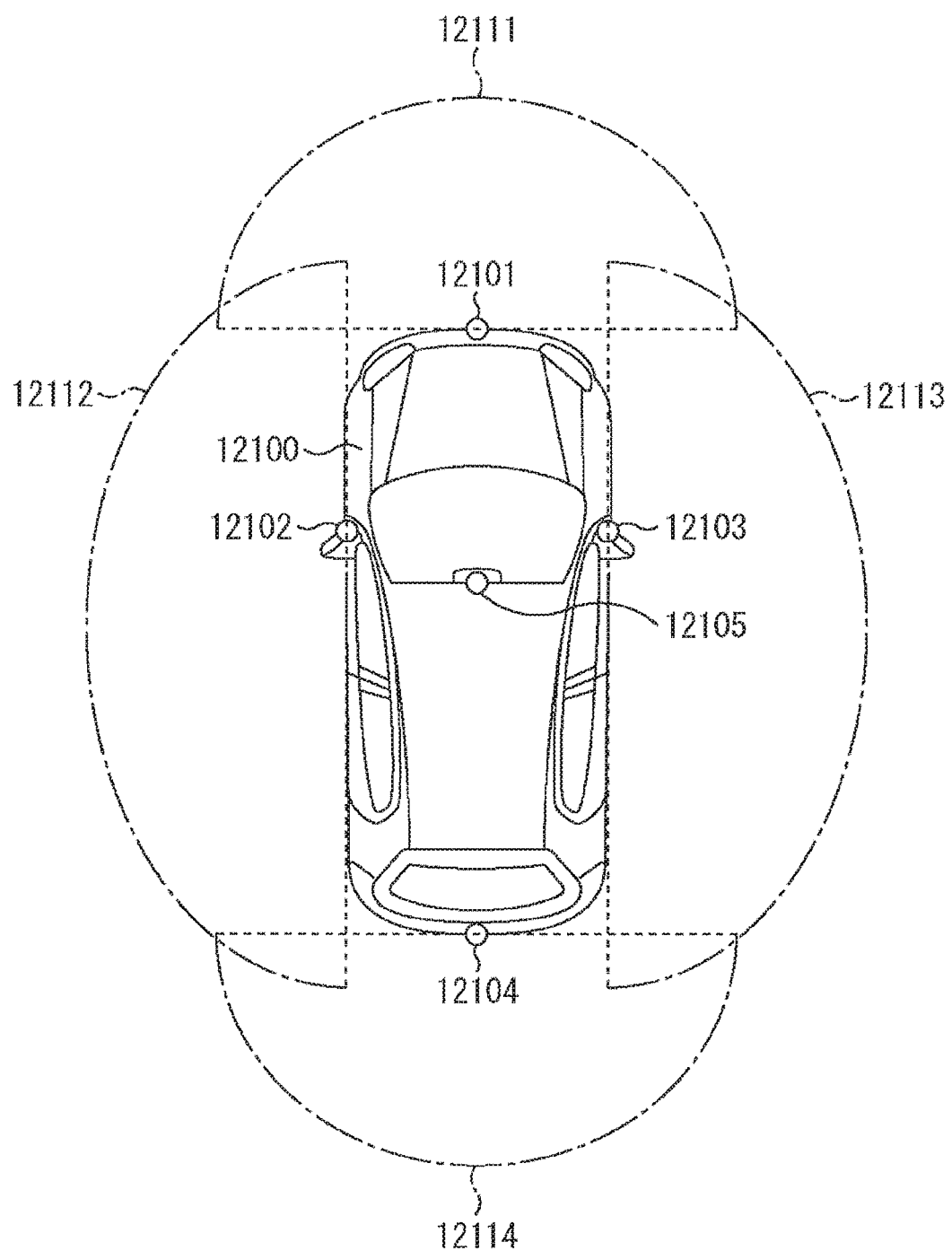

[FIG. 15]
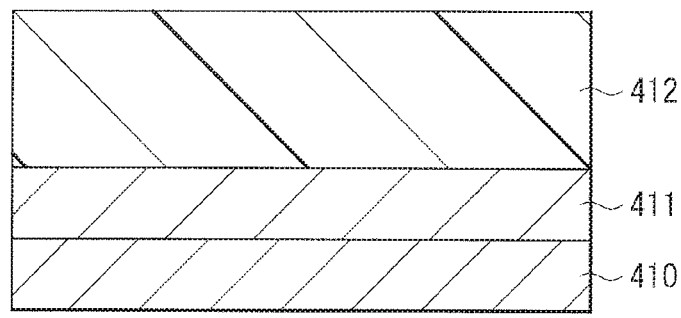
[FIG. 16]
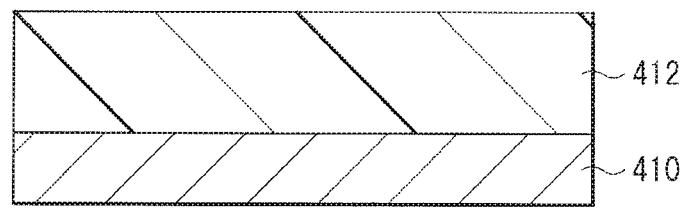
[FIG. 17]
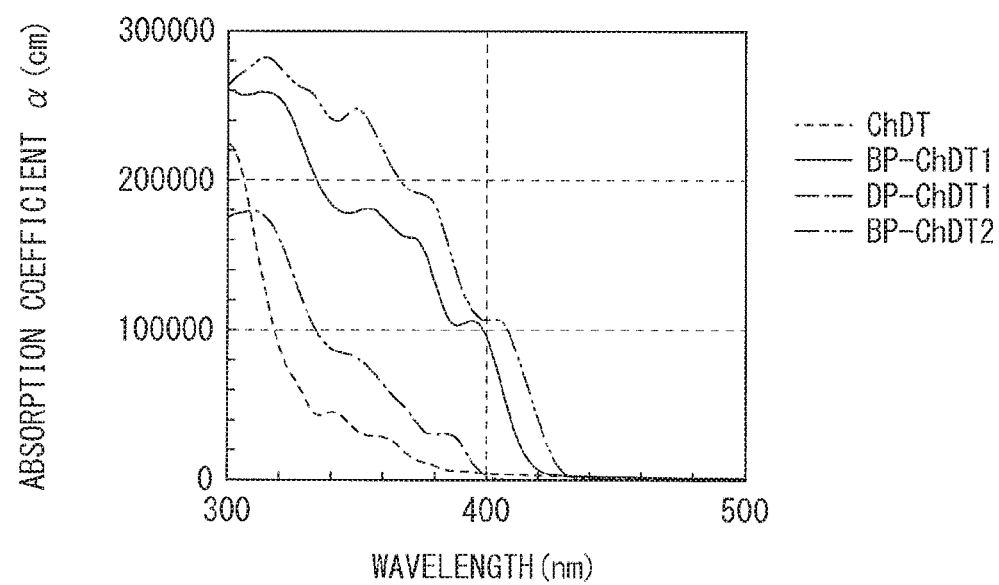

[FIG. 18]
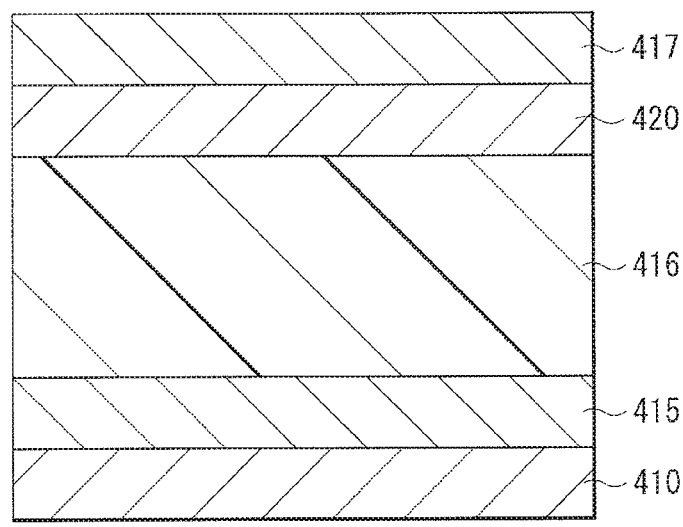
[FIG. 19]
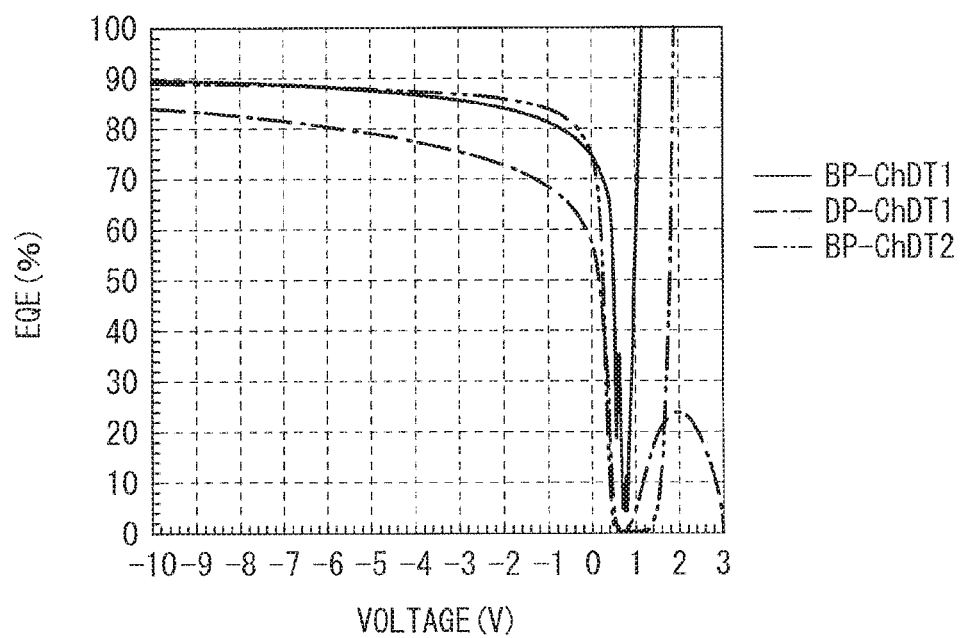

[FIG. 20]
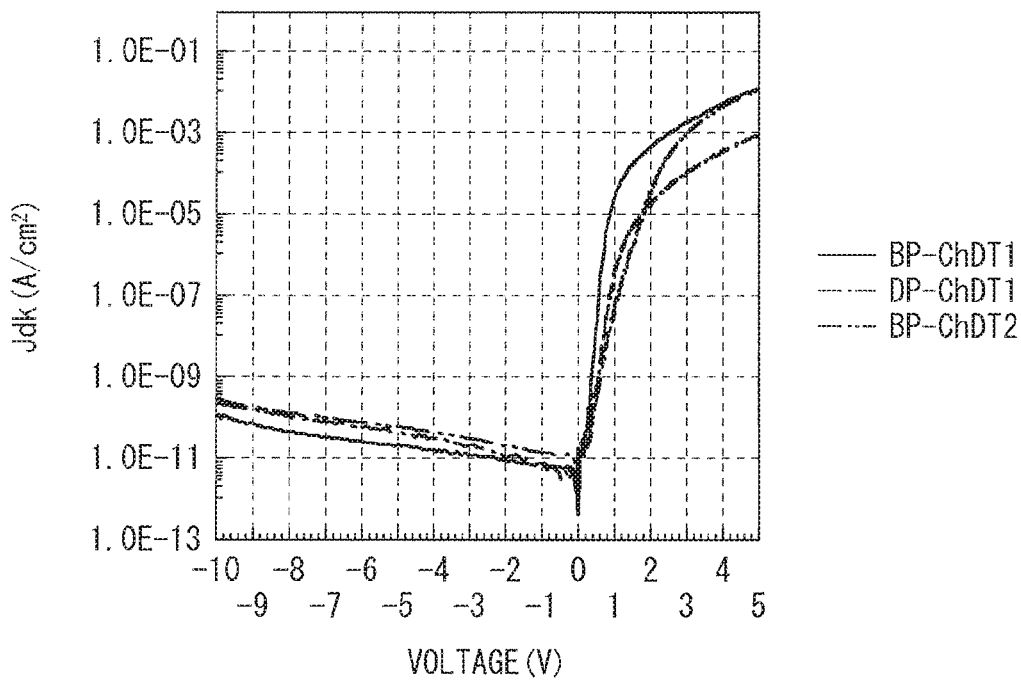
[FIG. 21]
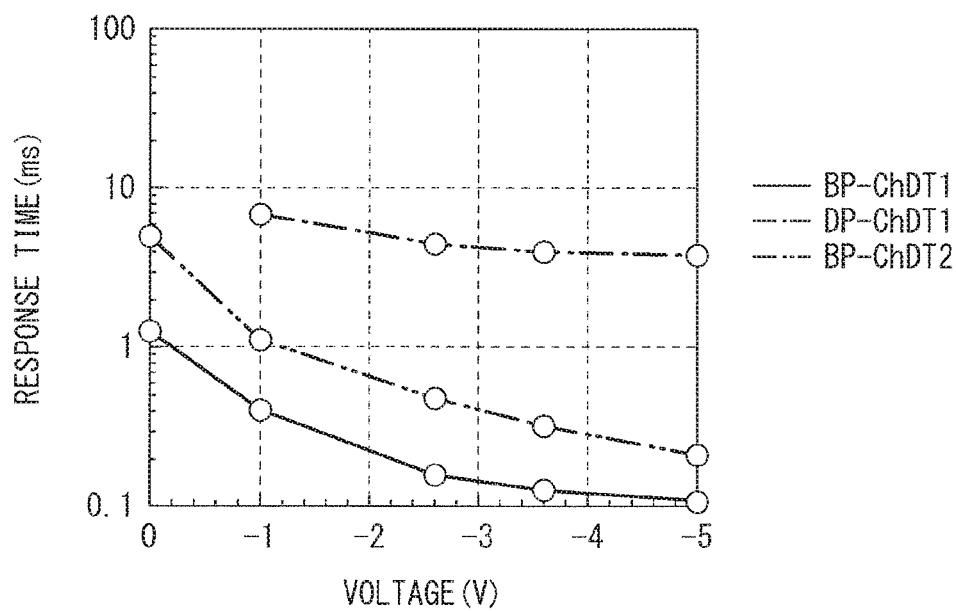

PHOTOELECTRIC CONVERSION ELEMENT AND SOLID-STATE IMAGING DEVICE

CROSS REFERENCE TO RELATED APPLICATIONS

This application is a U.S. National Phase of International Patent Application No. PCT/JP2018/030548 filed on Aug. 17, 2018, which claims priority benefit of Japanese Patent Application No. JP 2018-081098 filed in the Japan Patent Office on Apr. 20, 2018 and also claims priority benefit of Japanese Patent Application No. JP 2017-177775 filed in the Japan Patent Office on Sep. 15, 2017. Each of the above-referenced applications is hereby incorporated herein by reference in its entirety.

TECHNICAL FIELD

The present disclosure relates to a photoelectric conversion element using an organic semiconductor material and a solid-state imaging device including the photoelectric conversion element.

BACKGROUND ART

In recent years, a so-called vertical spectroscopic imaging element having a vertical multilayer structure using an organic photoelectric conversion film has been proposed. The organic photoelectric conversion film used in the vertical spectroscopic imaging element is required to have spectral characteristics of absorbing only light of a desired wavelength, high photoelectric conversion characteristics, low dark current characteristics, and high-speed response (on/off) characteristics.

Meanwhile, for example, PTL 1 discloses a solid-state imaging element including a photoelectric conversion film that includes a quinacridone derivative and a subphthalocyanine derivative as well as a transparent compound that does not absorb visible light. In this solid-state imaging element, formation of a photoelectric conversion film in which a light absorbing material such as the quinacridone derivative and a carrier transporting material are mixed achieves improvement in selective spectral characteristics, photoelectric conversion characteristics, low dark current characteristics, and responsiveness.

CITATION LIST

Patent Literature

PTL 1: Japanese Unexamined Patent Application Publication No. 2015-233117

SUMMARY OF THE INVENTION

As described, a photoelectric conversion element that configures a solid-state imaging device is required to have improved electric characteristics.

It is desirable to provide a photoelectric conversion element and a solid-state imaging device that make it possible to improve electric characteristics.

A photoelectric conversion element according to an embodiment of the present disclosure includes a first electrode, a second electrode disposed to be opposed to the first electrode, and an organic photoelectric conversion layer provided between the first electrode and the second electrode and including at least one of a Chryseno[1,2-b:8,7-b'] dithiophene (ChDT1) derivative represented by the following general formula (1) or a Chryseno[1,2-b:7,8-b'] dithiophene (ChDT2) derivative represented by the following general formula (2).

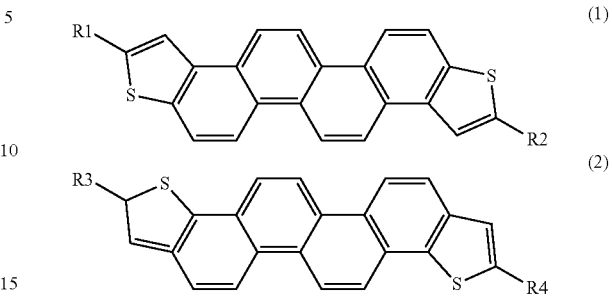

(R1 to R4 denote, each independently, a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof.)

A solid-state imaging device of an embodiment of the present disclosure includes pixels each including one or a plurality of organic photoelectric conversion sections, and includes the photoelectric conversion element of the embodiment of the present disclosure as the photoelectric conversion section.

In the photoelectric conversion element according to an embodiment of the present disclosure and the solid-state imaging device according to an embodiment of the present disclosure, the organic photoelectric conversion layer provided between the first electrode and the second electrode is formed using at least one of the ChDT1 derivative represented by the above general formula (1) or the ChDT2 derivative represented by the above general formula (2). This makes it possible to improve transporting performance of charges generated by photoelectric conversion without influencing spectral characteristics.

Effect of the Invention

According to the photoelectric conversion element of an embodiment of the present disclosure and the solid-state imaging device of an embodiment of the present disclosure, the organic photoelectric conversion layer is formed using at least one of the ChDT1 derivative represented by the above general formula (1) or the ChDT2 derivative represented by the above general formula (2), thus allowing for improvement in the transporting performance of charges without influencing the spectral characteristics. This makes it possible to improve electric characteristics of the photoelectric conversion element.

It is to be noted that the effects described here are not necessarily limitative, and may be any of the effects described in the present disclosure.

BRIEF DESCRIPTION OF THE DRAWINGS

FIG. 1 is a schematic cross-sectional view of a configuration of a photoelectric conversion element according to an embodiment of the present disclosure.

FIG. 2 is a schematic plan view of a configuration of a unit pixel of the photoelectric conversion element illustrated in FIG. 1.

FIG. 3 is a schematic cross-sectional view for describing a method of manufacturing the photoelectric conversion element illustrated in FIG. 1.

FIG. 4 is a schematic cross-sectional view of a step subsequent to FIG. 3.

FIG. 5A illustrates a structure of a ChDT1 mother skeleton as viewed in the Z-axis direction.

FIG. 5B illustrates a structure of the ChDT1 mother skeleton as viewed in the Y-axis direction.

FIG. 6 is a characteristic diagram illustrating the relationship between the deviation in the major axis direction of the molecule and the charge transfer integral.

FIG. 7 is a schematic cross-sectional view of a configuration of a photoelectric conversion element according to a modification example of the present disclosure.

FIG. 8 is a block diagram illustrating an overall configuration of a solid-state imaging element including the photoelectric conversion element illustrated in FIG. 1.

FIG. 9 is a functional block diagram illustrating an example of a solid-state imaging device (camera) using the solid-state imaging element illustrated in FIG. 8.

FIG. 10 is a block diagram depicting an example of a schematic configuration of an in-vivo information acquisition system.

FIG. 11 is a view depicting an example of a schematic configuration of an endoscopic surgery system.

FIG. 12 is a block diagram depicting an example of a functional configuration of a camera head and a camera control unit (CCU).

FIG. 13 is a block diagram depicting an example of schematic configuration of a vehicle control system.

FIG. 14 is a diagram of assistance in explaining an example of installation positions of an outside-vehicle information detecting section and an imaging section.

FIG. 15 is a cross-sectional view of a sample for evaluation of energy levels in Experiment 1.

FIG. 16 is a cross-sectional view of a sample for evaluation of spectral characteristics in Experiment 2.

FIG. 17 is a spectral characteristic diagram of a ChDT1 derivative.

FIG. 18 is a cross-sectional view of a sample for evaluation of electric characteristics in Experiment 2.

FIG. 19 is a characteristic diagram illustrating EQE in Experimental Examples 1 to 3.

FIG. 20 illustrates dark current characteristics of Experimental Examples 1 to 3.

FIG. 21 is a characteristic diagram illustrating responsiveness in Experimental Examples 1 to 3.

MODES FOR CARRYING OUT THE INVENTION

In the following, description is given of embodiments of the present disclosure in detail with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiments (A photoelectric conversion element including an organic photoelectric conversion layer that includes a ChDT1 derivative or a ChDT2 derivative)
　　1-1. Configuration of Photoelectric Conversion Element
　　1-2. Method of Manufacturing Photoelectric Conversion Element
　　1-3. Workings and Effects 2. Modification Example (A photoelectric conversion element in which a plurality of organic photoelectric conversion sections are stacked)
3. Application Examples
4. Working Examples

1. EMBODIMENT

FIG. 1 illustrates a cross-sectional configuration of a photoelectric conversion element (a photoelectric conversion element 10) according to an embodiment of the present disclosure. The photoelectric conversion element 10 constitutes one pixel (a unit pixel P) in a solid-state imaging element (a solid-state imaging element 1) such as a backside illumination type (backside light receiving type) CCD (Charge Coupled Device) image sensor or CMOS (Complementary Metal Oxide Semiconductor) image sensor (see FIG. 8). The photoelectric conversion element 10 is of a so-called vertical spectroscopic type in which one organic photoelectric conversion section 11G that selectively detects light in different wavelength regions to perform photoelectric conversion and two inorganic photoelectric conversion sections 11B and 11R are stacked in a vertical direction. In the present embodiment, an organic photoelectric conversion layer 16 that configures an organic photoelectric conversion section 11G has a configuration of including at least one of Chryseno[1,2-b:8,7-b']dithiophene derivative (hereinafter, referred to as a ChDT1 derivative) or Chryseno[1,2-b:7,8-b']dithiophene derivative (hereinafter, referred to as a ChDT2 derivative).

(1-1. Configuration of Photoelectric Conversion Element)

In the photoelectric conversion element 10, one organic photoelectric conversion section 11G and two inorganic photoelectric conversion sections 11B and 11R are stacked in the vertical direction for each unit pixel P. The organic photoelectric conversion section 11G is provided on side of a back surface (a first surface 11S1) of a semiconductor substrate 11. The inorganic photoelectric conversion sections 11B and 11R are each formed to be embedded in the semiconductor substrate 11, and are stacked in a thickness direction of the semiconductor substrate 11. The organic photoelectric conversion section 11G includes an organic photoelectric conversion layer 16 including a p-type semiconductor and an n-type semiconductor and having a bulk hetero junction structure in a layer. The bulk hetero junction structure is a p/n junction plane formed by mixing a p-type semiconductor and an n-type semiconductor.

The organic photoelectric conversion section 11G and the inorganic photoelectric conversion sections 11B and 11R perform photoelectric conversion by selectively detecting light of mutually different wavelengths. Specifically, the organic photoelectric conversion section 11G acquires a green (G) color signal. In the inorganic photoelectric conversion sections 11B and 11R, blue (B) and red (R) color signals are acquired, respectively, due to difference in absorption coefficients. This makes it possible for the photoelectric conversion element 10 to acquire a plurality of types of color signals in one pixel without using a color filter.

It is to be noted that description is give, in the present embodiment, of a case of reading electrons as signal charges from a pair of electrons and holes generated by photoelectric conversion (a case where an n-type semiconductor region is set as a photoelectric conversion layer). In addition, in the diagram, "+(plus)" attached to "p" and "n" indicates that p-type or n-type impurity concentration is high, and "++" indicates that the p-type or n-type impurity concentration is higher than that of "+".

The semiconductor substrate 11 is configured by, for example, an n-type silicon substrate, and includes a p-well 61 in a predetermined region. A second surface (front surface of the semiconductor substrate 11) 11S2 of the p-well 61 is provided with, for example, various floating diffusions (floating diffusion layers) FD (e.g., FD1, FD2, and FD3), various transistors Tr (e.g., a vertical transistor (transfer transistor) Tr1, a transfer transistor Tr2, an amplifier transistor (modulation element) AMP, and a reset transistor RST), and a multilayer wiring line 70. The multilayer wiring line 70 has a configuration in which, for example, wiring layers 71, 72, and 73 are stacked in an insulating layer 74. In addition, a peripheral circuit (not illustrated) including a logic circuit or the like is provided in a peripheral part of the semiconductor substrate 11.

It is to be noted that, in FIG. 1, side of the first surface 11S1 of the semiconductor substrate 11 is denoted by a light incident surface S1, and side of the second surface 11S2 thereof is denoted by a wiring layer side S2.

The inorganic photoelectric conversion sections 11B and 11R are each configured by, for example, a PIN (Positive Intrinsic Negative) type photodiode, and each have a p-n junction in a predetermined region of the semiconductor substrate 11. The inorganic photoelectric conversion sections 11B and 11R enable light to be dispersed in the vertical direction by utilizing different wavelength bands to be absorbed depending on incidence depth of light in the silicon substrate.

The inorganic photoelectric conversion section 11B selectively detects blue light and accumulates signal charges corresponding to blue color; the inorganic photoelectric conversion section 11B is installed at a depth at which the blue light is able to be efficiently subjected to photoelectric conversion. The inorganic photoelectric conversion section 11R selectively detects red light and accumulates signal charges corresponding to red light; the inorganic photoelectric conversion section 11R is installed at a depth at which the red light is able to be efficiently subjected to photoelectric conversion. It is to be noted that blue (B) is a color corresponding to a wavelength band of 450 nm to 495 nm, for example, and red (R) is a color corresponding to a wavelength band of 620 nm to 750 nm, for example. It is sufficient for each of the inorganic photoelectric conversion sections 11B and 11R to be able to detect light in a portion or all of each wavelength band.

Specifically, as illustrated in FIG. 1, each of the inorganic photoelectric conversion section 11B and the inorganic photoelectric conversion section 11R includes, for example, a p+ region serving as a hole accumulation layer and an n region serving as an electron accumulation layer (having a p-n-p stacked structure). The n region of the inorganic photoelectric conversion section 11B is coupled to the vertical transistor Tr1. The p+ region of the inorganic photoelectric conversion section 11B bends along the vertical transistor Tr1 and is coupled to the p+ region of the inorganic photoelectric conversion section 11R.

As described above, the second surface 11S2 of the semiconductor substrate 11 is provided with, for example, the floating diffusions (floating diffusion layers) FD1, FD2, and FD3, the vertical transistor (transfer transistor) Tr1, the transfer transistor Tr2, the amplifier transistor (modulation element) AMP, and the reset transistor RST.

The vertical transistor Tr 1 is a transfer transistor that transfers signal charges (electrons in this case), corresponding to a blue color and generated and accumulated in the inorganic photoelectric conversion section 11B, to the floating diffusion FD1. The inorganic photoelectric conversion section 11B is formed at a deep position from the second surface 11S2 of the semiconductor substrate 11, and thus the transfer transistor of the inorganic photoelectric conversion section 11B is preferably configured by the vertical transistor Tr1.

The transfer transistor Tr 2 transfers signal charges (electrons in this case), corresponding to a red color and generated and accumulated in the inorganic photoelectric conversion section 11R, to the floating diffusion FD2; the transfer transistor Tr 2 is configured by, for example, a MOS transistor.

The amplifier transistor AMP is a modulation element that modulates a charge amount generated in the organic photoelectric conversion section 11G into a voltage, and is configured by, for example, a MOS transistor.

The reset transistor RST resets charges transferred from the organic photoelectric conversion section 11G to the floating diffusion FD3, and is configured by, for example, a MOS transistor.

A lower first contact 75, a lower second contact 76, and an upper contact 13B are each configured by a doped silicon material such as PDAS (Phosphorus Doped Amorphous Silicon), or a metal material such as aluminum (Al), tungsten (W), titanium (Ti), cobalt (Co), hafnium (Hf), or tantalum (Ta), for example.

The organic photoelectric conversion section 11G is provided on the side of the first surface 11S1 of the semiconductor substrate 11. The organic photoelectric conversion section 11G has a configuration in which, for example, a lower electrode 15, the organic photoelectric conversion layer 16, and an upper electrode 17 are stacked in this order from the side of the first surface 11S1 of the semiconductor substrate 11. The lower electrode 15 is formed separately for each photoelectric conversion element 10, for example. The organic photoelectric conversion layer 16 and the upper electrode 17 are provided as successive layers shared by a plurality of photoelectric conversion elements 10. The organic photoelectric conversion section 11G is an organic photoelectric conversion element that absorbs green light corresponding to a portion or all of a selective wavelength band (e.g., in a range from 450 nm to 650 nm) and generates electron-hole pairs.

Interlayer insulating layers 12 and 14 are stacked in this order, for example, from side of the semiconductor substrate 11 between the first surface 11S1 of the semiconductor substrate 11 and the lower electrode 15. The interlayer insulating layer has a configuration in which, for example, a layer having a fixed charge (fixed charge layer) 12A and a dielectric layer 12B having an insulating property are stacked. A protective layer 18 is provided on the upper electrode 17. An on-chip lens layer 19, which configures an on-chip lens 19L and serves also as a planarization layer, is disposed above the protective layer 18.

A through electrode 63 is provided between the first surface 11S1 and the second surface 11S2 of the semiconductor substrate 11. The organic photoelectric conversion section 11G is coupled to a gate Gamp of the amplifier transistor AMP and the floating diffusion FD3 via the through electrode 63. This makes it possible for the photoelectric conversion element 10 to favorably transfer a charge generated in the organic photoelectric conversion section 11G on the side of the first surface 11S1 of the semiconductor substrate 11 to the side of the second surface 11S2 of the semiconductor substrate 11 via the through electrode 63, and thus to enhance the characteristics.

The through electrode 63 is provided, for example, for each organic photoelectric conversion section 11G of the photoelectric conversion element 10. The through electrode 63 functions as a connector between the organic photoelectric conversion section 11G and the gate Gamp of the amplifier transistor AMP as well as the floating diffusion FD3, and serves as a transmission path for a charge generated in the organic photoelectric conversion section 11G.

The lower end of the through electrode 63 is coupled to, for example, a coupling section 71A in the wiring layer 71, and the coupling section 71A and the gate Gamp of the amplifier transistor AMP are coupled to each other via the lower first contact 75. The coupling section 71 A and the floating diffusion FD3 are coupled to the lower electrode 15 via the lower second contact 76. It is to be noted that, in FIG. 1, the through electrode 63 is illustrated to have a cylindrical shape, but this is not limitative; the through electrode 63 may have a tapered shape, for example.

As illustrated in FIG. 1, a reset gate Grst of the reset transistor RST is preferably disposed next to the floating diffusion FD3. This makes it possible to reset charges accumulated in the floating diffusion FD3 by the reset transistor RST.

In the photoelectric conversion element 10 of the present embodiment, light incident on the organic photoelectric conversion section 11G from side of the upper electrode 17 is first absorbed by the organic photoelectric conversion layer 16. Excitons thus generated move to an interface between an electron donor and an electron acceptor that constitute the organic photoelectric conversion layer 16, and undergo exciton separation, i.e., dissociate into electrons and holes. The charges (electrons and holes) generated here are transported to different electrodes by diffusion due to a difference in carrier concentrations or by an internal electric field due to a difference in work functions between an anode (here, the upper electrode 17) and a cathode (here, the lower electrode 15), and are detected as a photocurrent. In addition, application of an electric potential between the lower electrode 15 and the upper electrode 17 makes it possible to control directions in which electrons and holes are transported.

In the following, description is given of configurations, materials, and the like of the respective sections.

The organic photoelectric conversion section 11G is an organic photoelectric conversion element that absorbs green light corresponding to a portion or all of a selective wavelength band (e.g., in a range from 450 nm to 650 nm) and generates electron-hole pairs.

The lower electrode 15 is provided in a region opposed to and covering light receiving surfaces of the inorganic photoelectric conversion sections 11B and 11R formed in the semiconductor substrate 11. The lower electrode 15 is configured by an electrically-conductive film having light-transmissivity, and is configured by, for example, ITO (indium-tin-oxide). However, in addition to the ITO, a dopant-doped tin oxide ($SnO_2$)-based material or a zinc oxide-based material in which aluminum zinc oxide (ZnO) is doped with a dopant may be used as a constituent material of the lower electrode 15. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Aside from those mentioned above, for example, CuI, $InSbO_4$, ZnMgO, $CuInO_2$, $MgIN_2O_4$, CdO, $ZnSnO_3$, or the like may be used.

The organic photoelectric conversion layer 16 converts optical energy into electric energy. The organic photoelectric conversion layer 16 includes, for example, two or more types of organic semiconductor materials, and preferably includes, for example, one or both of a p-type semiconductor and an n-type semiconductor. For example, one of the p-type semiconductor and the n-type semiconductor is preferably a material having transmissivity to visible light, and the other thereof is preferably a material that performs photoelectric conversion of light in a selective wavelength region (e.g., in a range from 450 nm to 650 nm). In the present embodiment, as the p-type semiconductor, one or more of a ChDT1 derivative or a ChDT2 derivative are included, which absorbs less visible light of a mother skeleton, and are illustrated below and represented by the following general formula (1) or general formula (2).

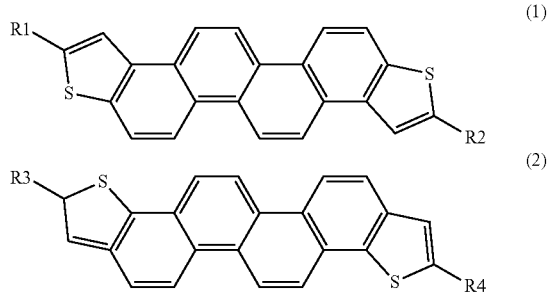

(R1 to R4 denote, each independently, a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof.)

The ChDT1 derivative and the ChDT2 derivative preferably have, for example, transmissivity to visible light; specifically, the ChDT1 derivative and the ChDT2 derivative preferably do not have a maximum absorption wavelength in a wavelength region from 500 nm to 600 nm. In addition, energy levels of the highest occupied molecular orbital (Highest Occupied Molecular Orbital; HOMO) and the lowest unoccupied molecular orbital (Lowest Unoccupied Molecular Orbital; LUMO) of each of the ChDT1 derivative and the ChDT2 derivative are preferably energy levels at which a photoelectric conversion mechanism is smoothly performed on other materials configuring the organic photoelectric conversion layer 16. This is to rapidly separate excitons generated in the organic photoelectric conversion layer 16 by optical absorption into carriers, and to quickly move the generated carriers to, for example, the lower electrode 15a. For example, the ChDT1 derivative and the ChDT2 derivative preferably have appropriate HOMO energy difference from other materials configuring the organic photoelectric conversion layer 16. In addition, for example, the ChDT1 derivative and the ChDT2 derivative preferably have a sufficient difference between LUMO energy of other materials configuring the organic photoelectric conversion layer 16 and the HOMO energy of each of the ChDT1 derivative and the ChDT2 derivative. Specifically, the HOMO level of each of the ChDT1 derivative and the ChDT2 derivative is preferably, for example, in a range from −6.0 eV to −5.0 eV. In addition, the LUMO level of each of the ChDT1 derivative and the ChDT2 derivative is preferably, for example, in a range from −3.0 eV to −2.0 eV. It is to be noted that an absolute value of the energy level of the HOMO corresponds to energy for extracting electrons from the HOMO to the outside (into vacuum), i.e., ionization potential. As a measurement method of the HOMO value, for example, measurement is possible using a photoelectron spectrometer by means of ultraviolet photoelectron spectroscopy (UPS; Ultraviolet Photoelectron Spectroscopy) in which a thin film including an organic material is formed on a substrate of an electrically-conductive film (ITO, Si, etc.) and ultraviolet rays are applied thereto. A LUMO value is able to be obtained by calculating an optical bandgap from results of spectroscopic measurement and calculating an HOMO level using the optical bandgap and UPS.

The ChDT1 derivative and ChDT2 derivative preferably have an aryl group, each independently, in R1 and R2 and in R3 and R4. Specific examples of the aryl group include a group having a polycyclic aromatic hydrocarbon having 6 to 60 carbon atoms, such as a phenyl group, a biphenyl group, a triphenyl group, a terphenyl group, a stilbene group, a naphthyl group, an anthracenyl group, a phenanthrenyl group, a pyrenyl group, a perylenyl group, a tetracenyl group, a chrysenyl group, a fluorenyl group, an acenaphthacenyl group, a triphenylene group, or a fluoranthene group each having 6 to 60 carbon atoms, or a derivative thereof. Among those, R1 and R2 as well as R3 and R4 are, each independently, preferably a biphenyl group, a terphenyl group, or a terphenyl group each having a structure in which two or more phenyl groups are covalently bonded together by a single bond, or a derivative thereof, and especially those having a structure in which a phenyl group and a derivative thereof are bonded together at para positions.

Specific examples of the ChDT1 derivative and the ChDT2 derivative include compounds represented by the following general formulae (3) to (10).

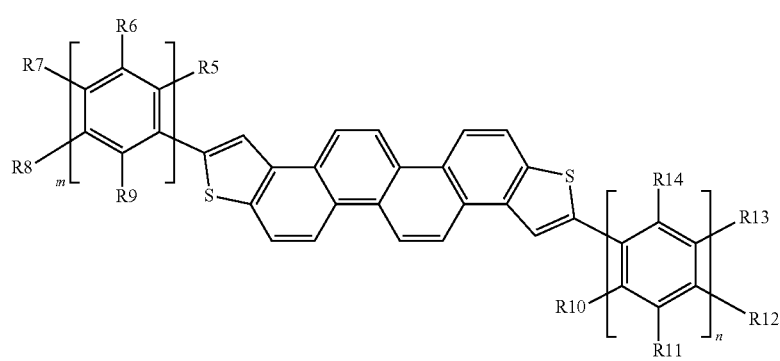

(3)

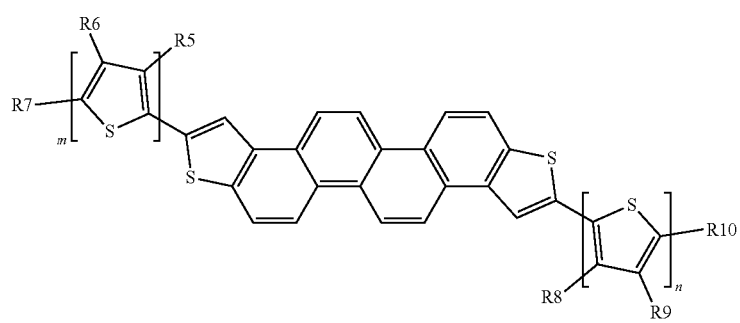

(4)

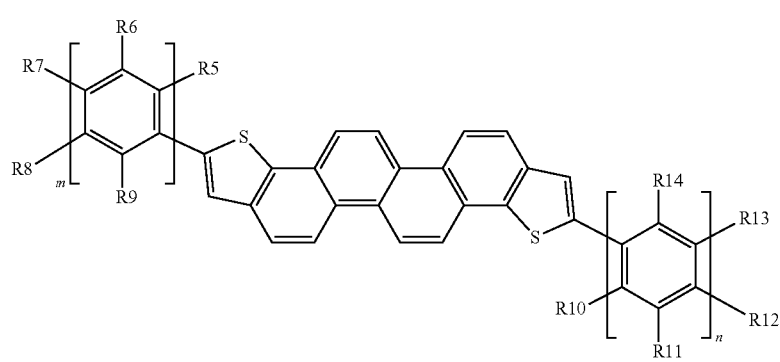

(5)

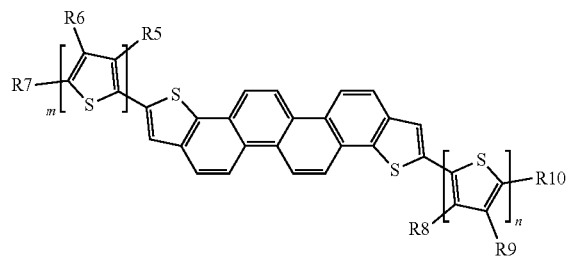

(6)

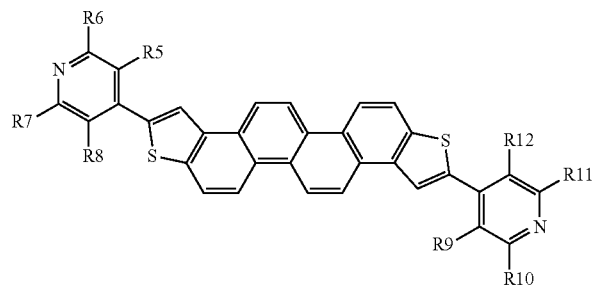

(7)

-continued
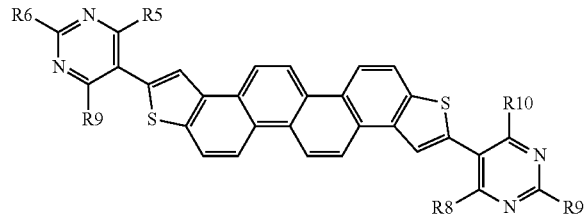
(8)
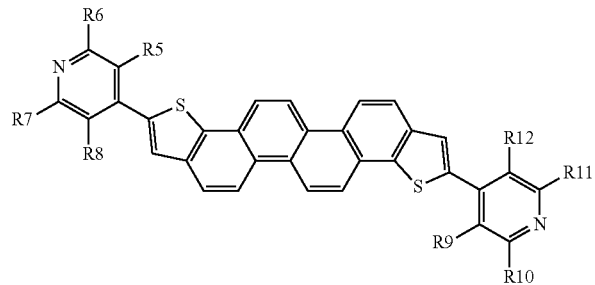
(9)
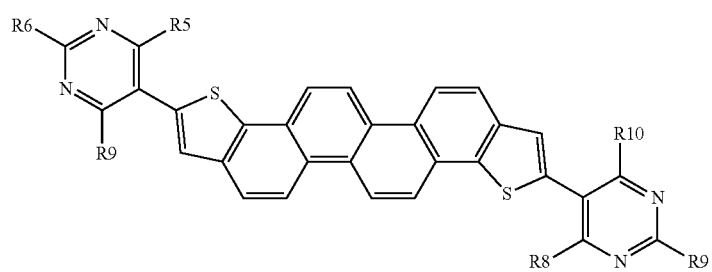
(10)
More specific examples of the ChDT1 derivative include compounds represented by the following formulae (1-1) to (1-25).
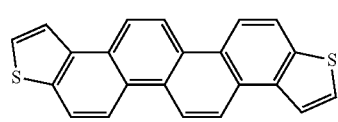
(1-1)
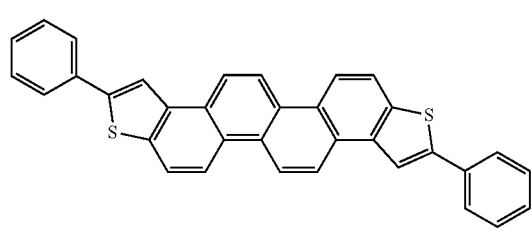
(1-2)
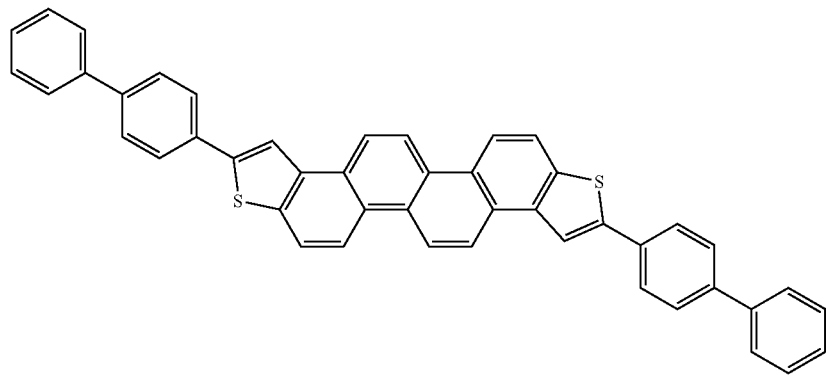
(1-3)

-continued
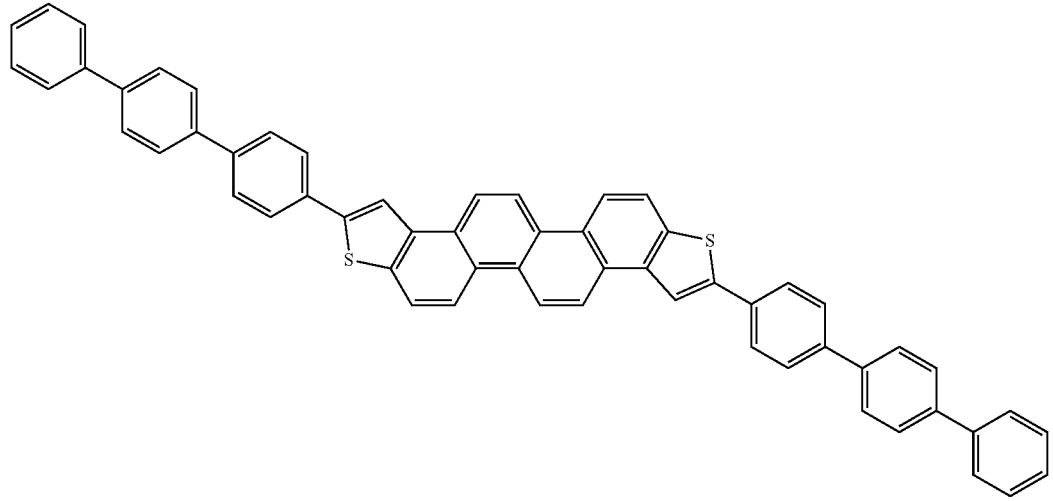
(1-4)
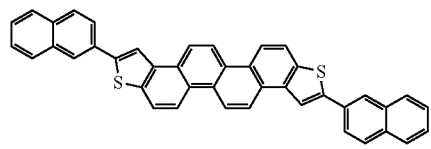
(1-5)
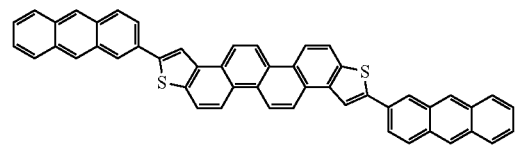
(1-6)
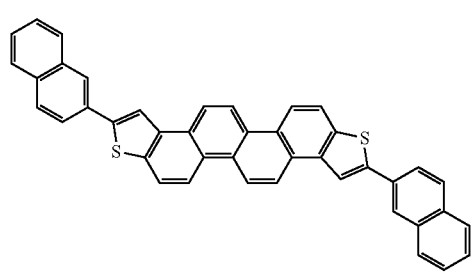
(1-7)
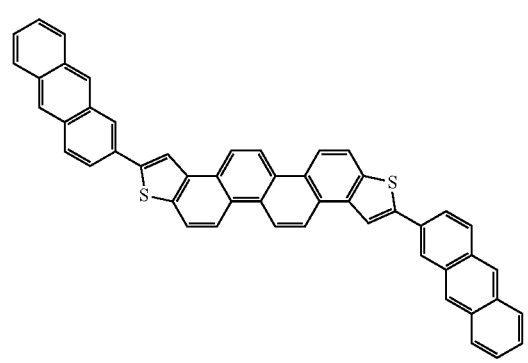
(1-8)
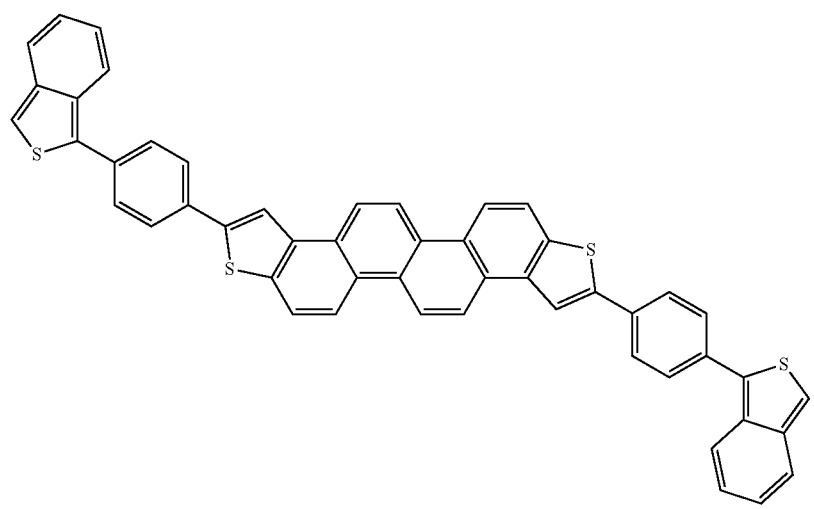
(1-9)

(1-10)
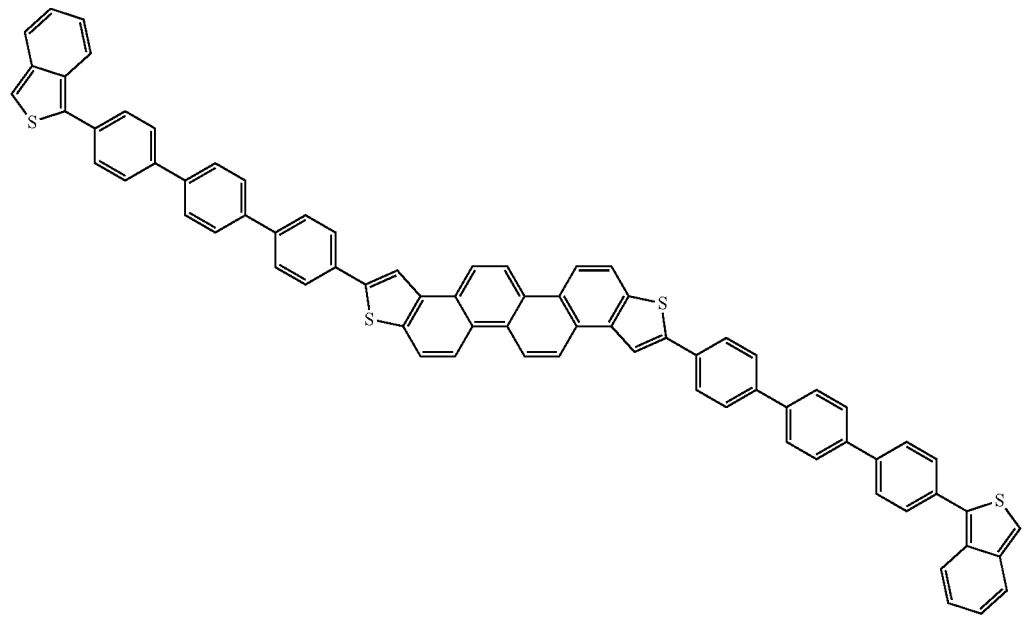
(1-11)
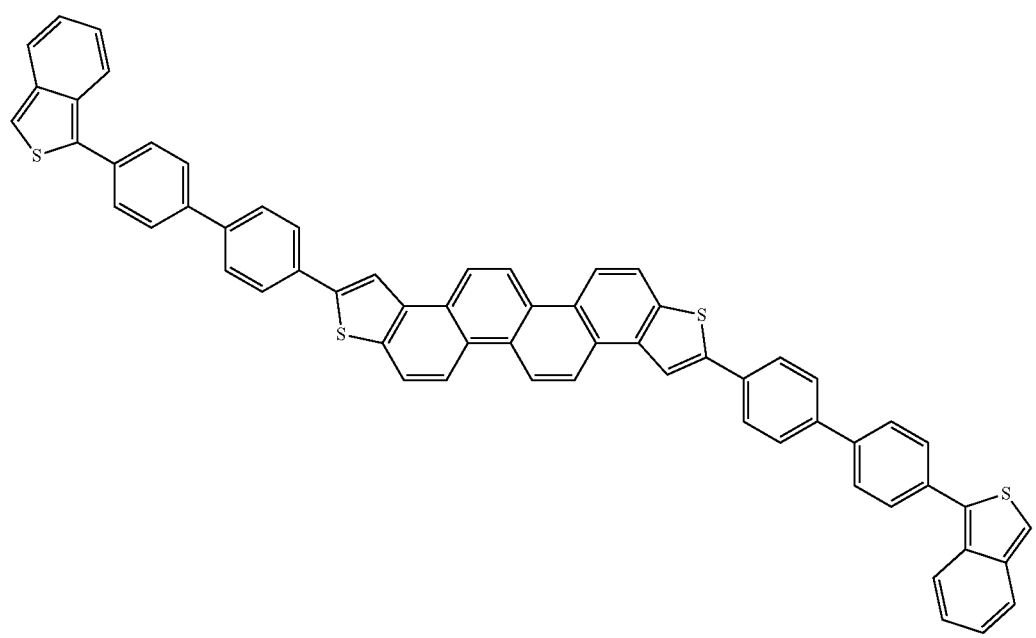

-continued
(1-12)
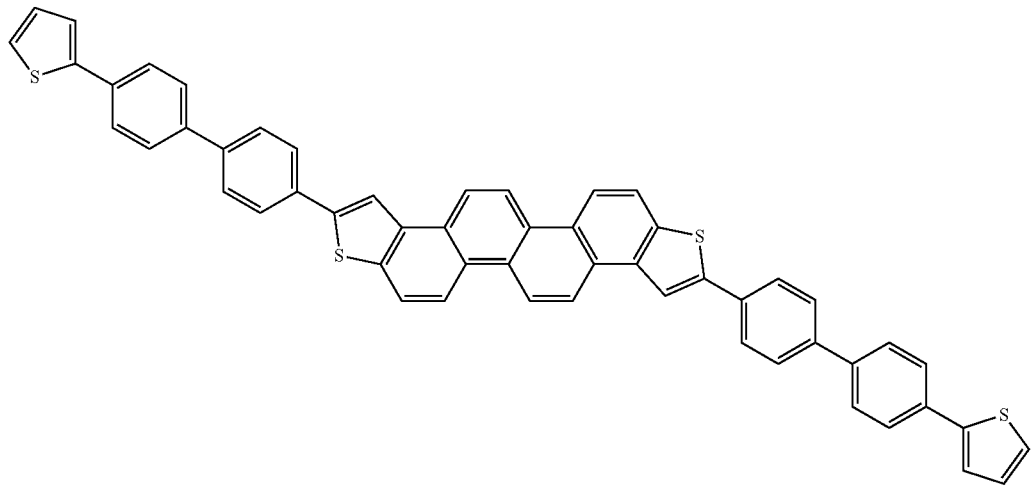
(1-13)
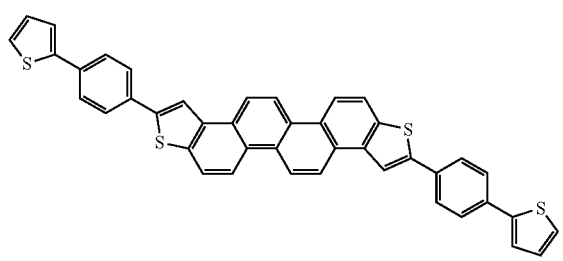
(1-14)
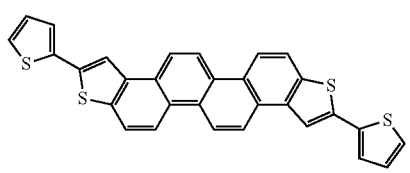
(1-15)
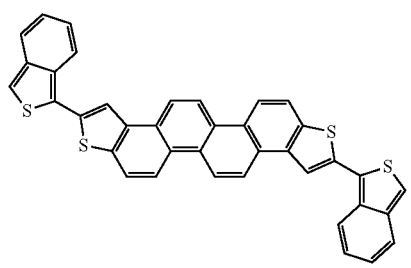
(1-16)
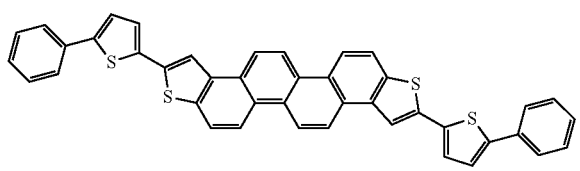
(1-17)
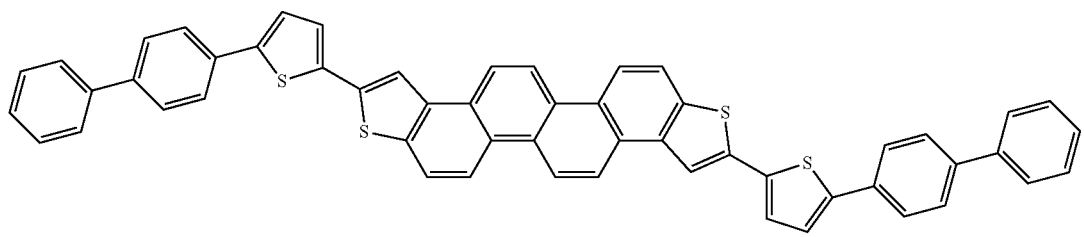
(1-18)
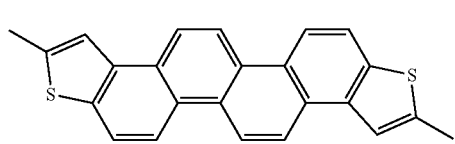
(1-19)
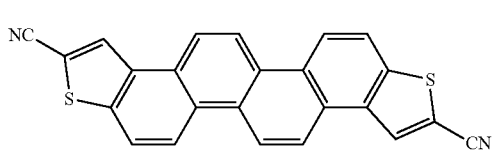

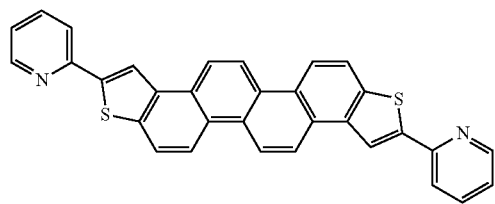
(1-20)
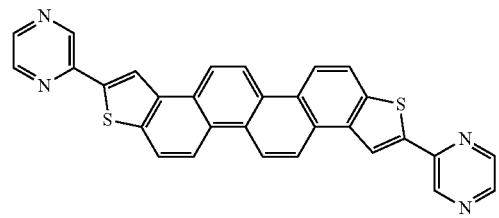
(1-21)
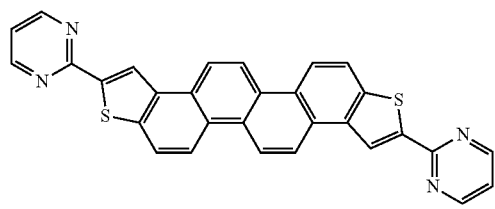
(1-22)
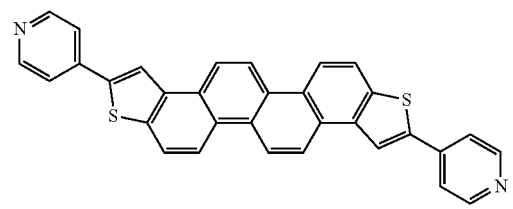
(1-23)
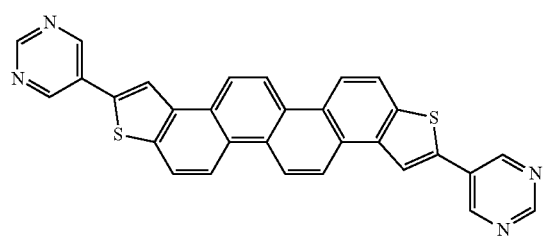
(1-24)
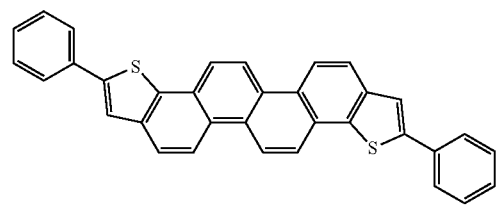
(1-25)
More specific examples of the ChDT2 derivative include compounds represented by the following formulae (2-1) to (2-25).
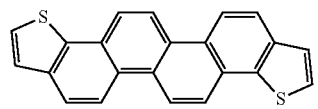
(2-1)
(2-2)
(2-3)
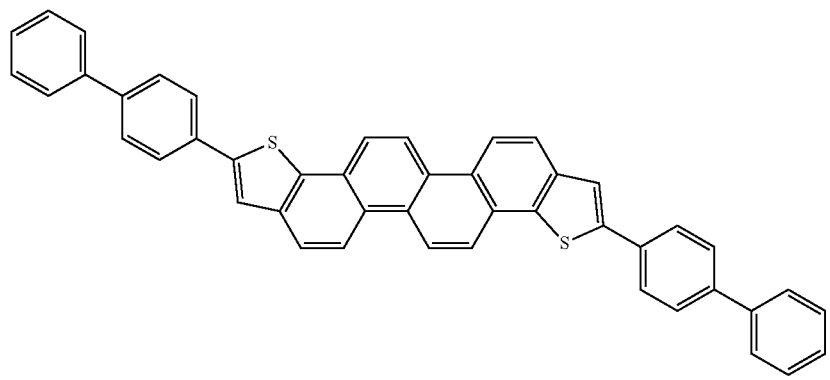

(2-4)
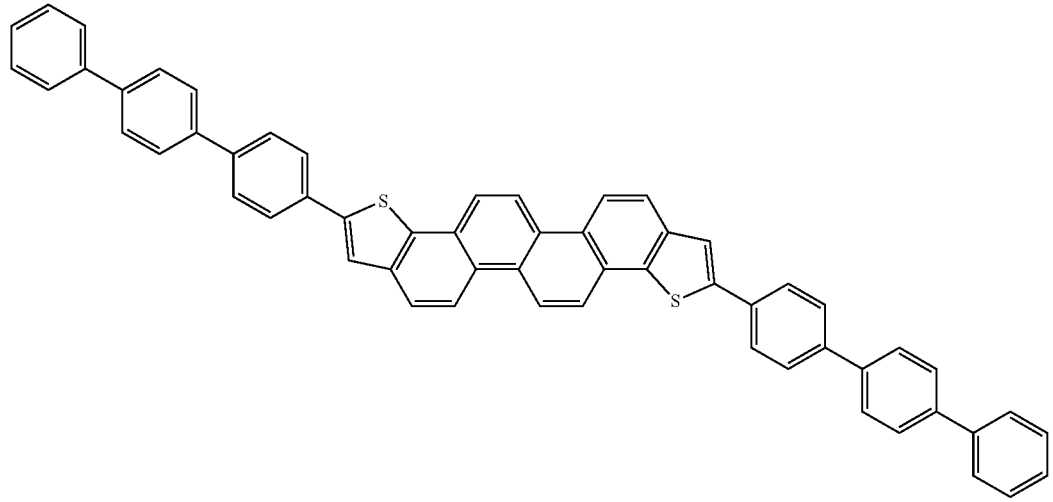
(2-5)
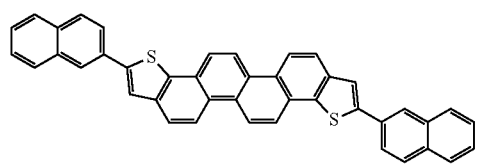
(2-6)
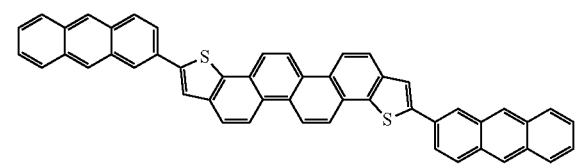
(2-7)
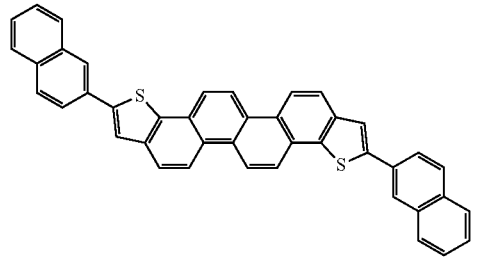
(2-8)
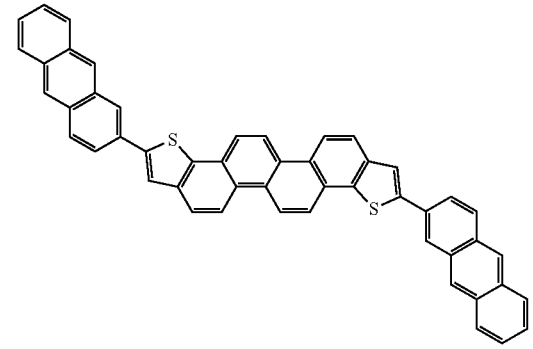
(2-9)
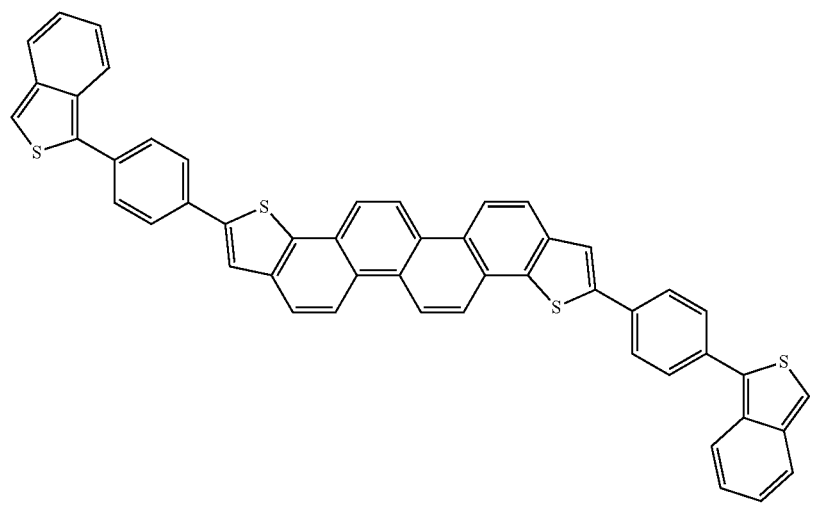

(2-10)
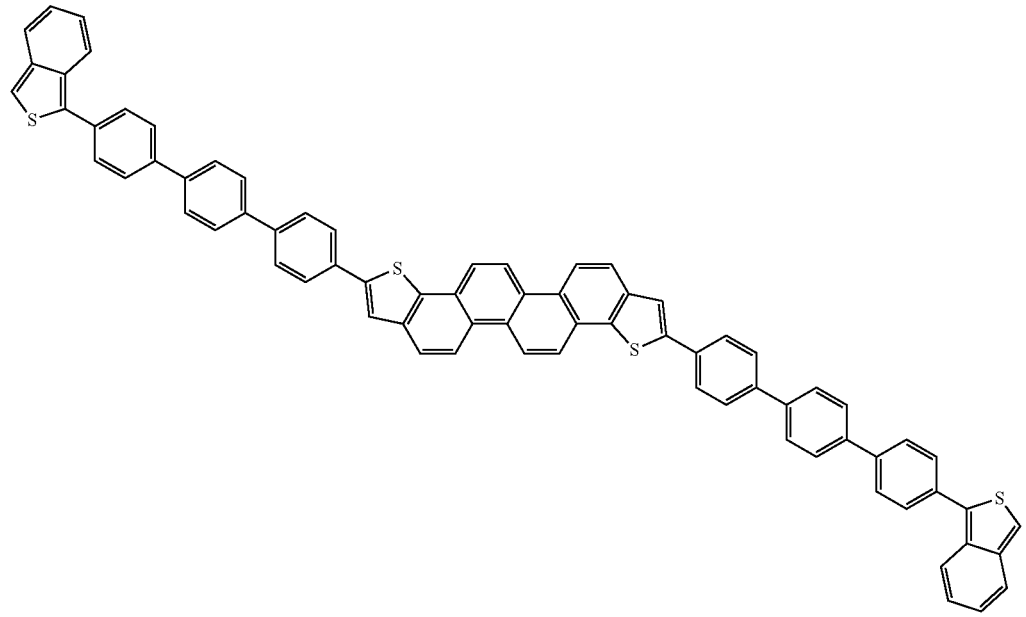
(2-11)
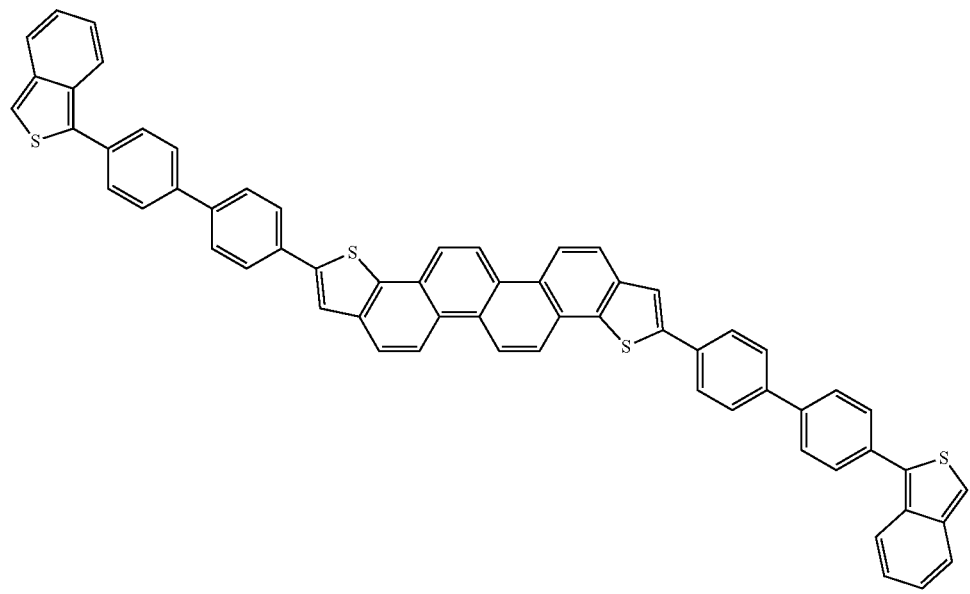

(2-12)
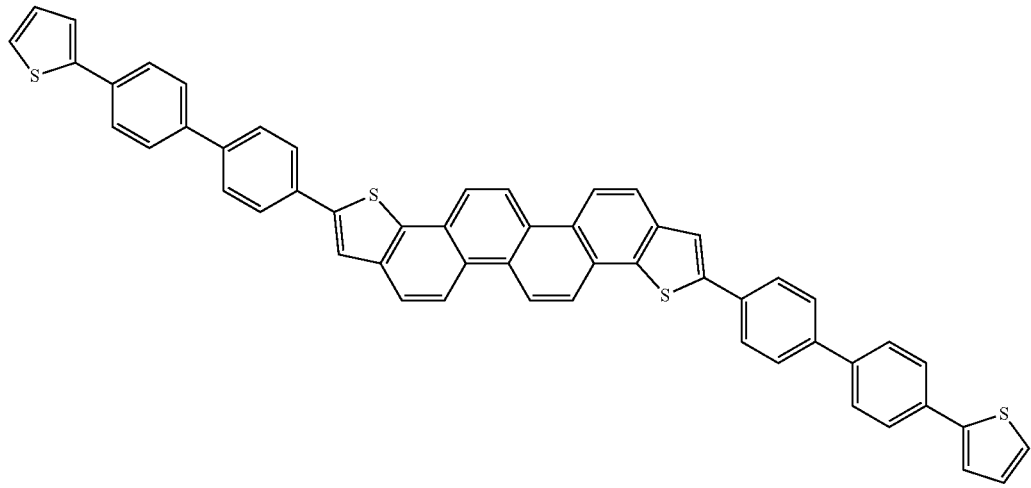
(2-13)
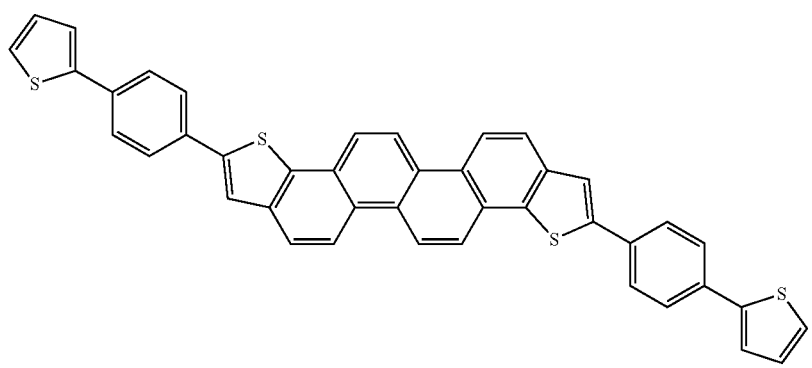
(2-14)
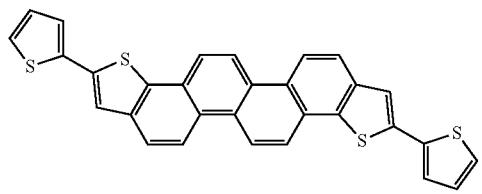
(2-15)
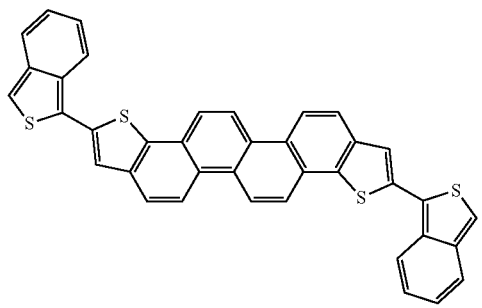
(2-16)
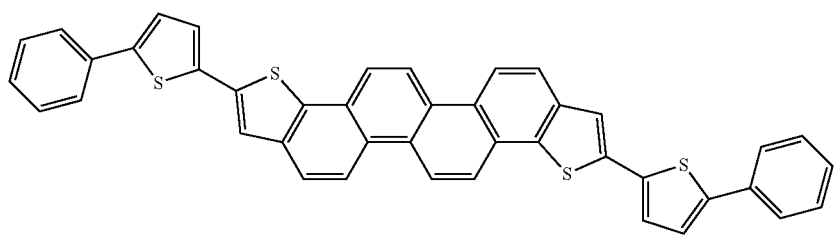
(2-17)
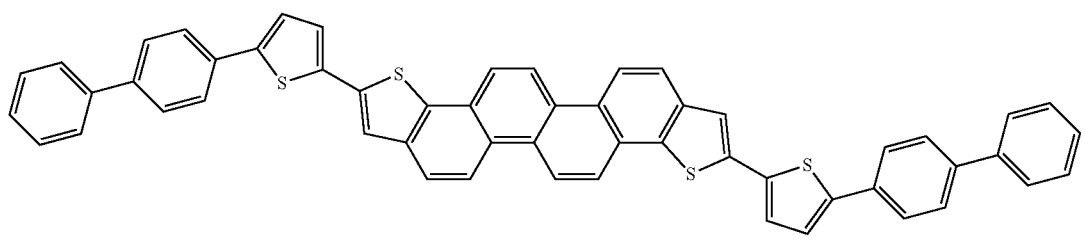

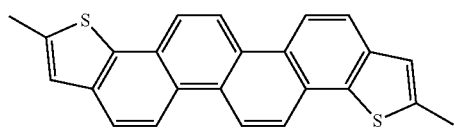
(2-18)

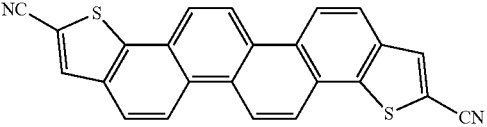
(2-19)

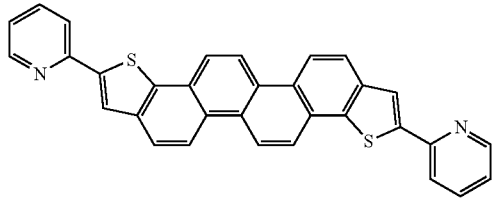
(2-20)

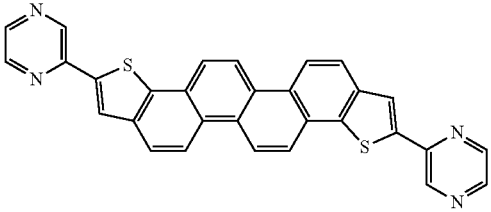
(2-21)

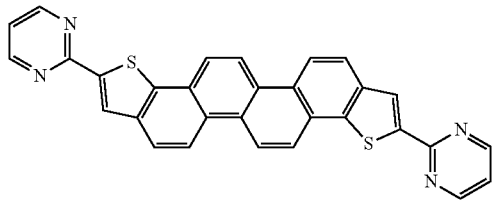
(2-22)

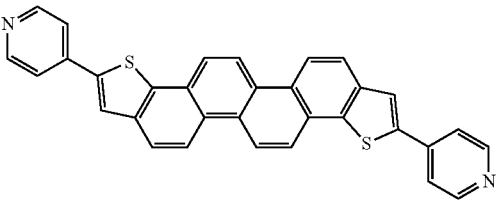
(2-23)

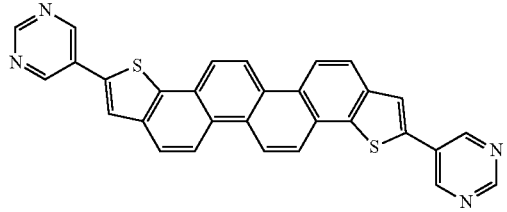
(2-24)

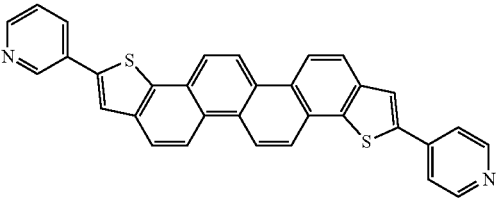
(2-25)

It is to be noted that the above description exemplifies the ChDT1 derivative and the ChDT2 derivative having the symmetrical structure in which R1 and R2 as well as R3 and R4 denote the same substituents as each other; however, this is not limitative. The ChDT1 derivative and the ChDT2 derivative may have an asymmetric structure in which different substituents are bonded to R1 and R2 in the above general formula (1) and to R3 and R4 in the above general formula (2).

It is preferable to use, as the organic photoelectric conversion layer 16, a material (light absorber) that performs photoelectric conversion of light in a selective wavelength region, in addition to the above-described ChDT1 derivative or ChDT2 derivative. For example, it is preferable to use an organic semiconductor material having a maximum absorption wavelength on side of a longer wavelength than blue light (a wavelength of 450 nm); more specifically, it is preferable to use an organic semiconductor material having a maximum absorption wavelength in a wavelength region, for example, from 500 nm to 600 nm. This makes it possible to perform selective photoelectric conversion of green light in the organic photoelectric conversion section 11G. Examples of such a material include subphthalocyanine represented by the following general formula (11) or a derivative thereof.

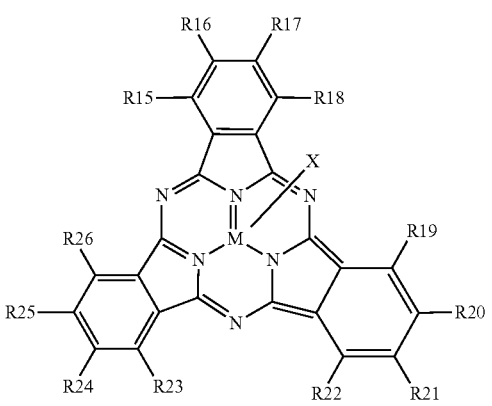
(11)

(R15 to R26 are, each independently, selected from the group consisting of a hydrogen atom, a halogen atom, a linear, branched, or cyclic alkyl group, a thioalkyl group, a thioaryl group, an aryl sulfonyl group, an alkyl sulfonyl group, an amino group, an alkylamino group, an aryl amino group, a hydroxy group, an alkoxy group, an acylamino group, an acyloxy group, a phenyl group, a carboxy group, a carboxamide group, a carboalkoxy group, an acyl group, a sulfonyl group, a cyano group, and a nitro group, and any adjacent R15 to R26 may be a portion of a condensed aliphatic ring or a condensed aromatic ring. The condensed aliphatic ring or the condensed aromatic ring may contain one or more atoms other than carbon. M denotes boron or divalent or trivalent metal. X denotes any substituent selected from the group consisting of halogen, a hydroxy group, a thiol group, an imide group, a substituted or unsubstituted alkoxy group, a substituted or unsubstituted aryloxy group, a substituted or unsubstituted alkyl group, a substituted or unsubstituted alkylthio group, and a substituted or unsubstituted arylthio group).

It is preferable to use, as the organic photoelectric conversion layer 16, for example, C60 fullerene represented by the following general formula (12) or a derivative thereof, or C70 fullerene represented by the following general formula (13) or a derivative thereof, in addition to the above-described ChDT1 derivative or ChDT2 derivative. The use of at least one of the fullerene 60 or the fullerene 70 or a derivative thereof makes it possible to further improve photoelectric conversion efficiency and to reduce a dark current.

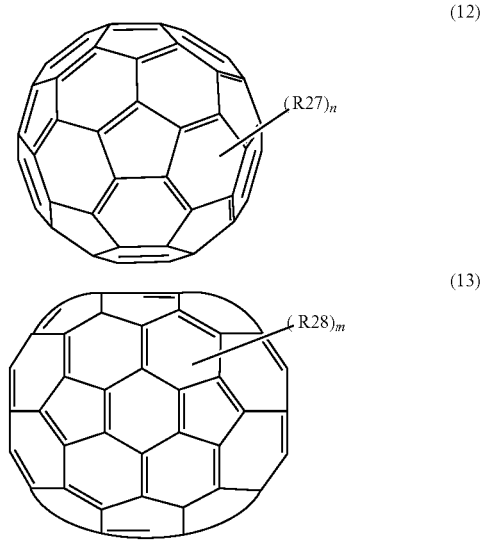

(12)

(13)

(R27 and R28 each denote a hydrogen atom, a halogen atom, a linear, branched, or cyclic alkyl group, a phenyl group, a group having a linear or condensed ring aromatic compound, a group having a halide, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino group, an acyl oxy group, a carbonyl group, a carboxyl group, a carboxamide group, a carboalkoxy group, an acyl group, a sulfonyl group, a cyano group, a nitro group, a group having a chalcogenide, a phosphine group, a phosphone group, or a derivative thereof. n and m each denote an integer equal to or greater than 2).

The organic photoelectric conversion layer 16 is preferably formed using, for example, one of each of the above-described ChDT1 derivative or ChDT2 derivative, subphthalocyanine or a derivative thereof, and the fullerene 60, the fullerene 70, or a derivative thereof. The ChDT1 derivative or the ChDT2 derivative, the subphthalocyanine or a derivative thereof, and the fullerene 60, the fullerene 70, or a derivative thereof function as a p-type semiconductor or an n-type semiconductor, respectively, depending on materials to be combined together.

Table 1 summarizes, as examples of the ChDT1 derivative, the HOMO energy and the LUMO energy of the ChDT1 represented by the formula (1-1), BP-ChDT1 represented by the formula (1-3), BP-ChDT2 represented by the formula (2-3), DP-ChDT1 represented by the formula (1-2), and $F_6$-SubPc-$OC_6F_5$ and C60 as examples of a subphthalocyanine derivative and a fullerene derivative. The ChDT1 derivative and the ChDT2 derivative preferably have greater HOMO energy than that of other materials configuring the organic photoelectric conversion layer 16; the difference between the HOMO energy of each of the ChDT1 derivative and the ChDT2 derivative and the HOMO energy of other materials configuring the organic photoelectric conversion layer 16 is preferably equal to or greater than 0.1 eV, for example, and is preferably equal to or smaller than 1.5 eV, for example, as the upper limit of the difference. In addition, the ChDT1 derivative and the ChDT2 derivative preferably have greater LUMO energy than that of other materials configuring the organic photoelectric conversion layer 16; the difference between the LUMO energy of each of the ChDT1 derivative and the ChDT2 derivative and the LUMO energy of other materials configuring the organic photoelectric conversion layer 16 is preferably equal to or greater than 0.1 eV, for example, and is preferably equal to or smaller than 2.5 eV, for example, as the upper limit of the difference.

TABLE 1

| | HOMO (eV) | LUMO (eV) |
|---|---|---|
| ChDT1 | −5.8 | −2.1 |
| BP-ChDT1 | −5.8 | −2.8 |
| BP-ChDT2 | −5.7 | −2.8 |
| DP-ChDT1 | −5.7 | −2.5 |
| $F_6$-SubPc-$OC_6F_5$ | −6.6 | −4.5 |
| C60 | −6.3 | −4.5 |

As described above, the organic photoelectric conversion layer 16 includes a junction surface (p/n junction surface) between the p-type semiconductor and the n-type semiconductor inside the layers. The p-type semiconductor functions relatively as an electron donor (donor), and the n-type semiconductor functions relatively as an electron acceptor (acceptor). The organic photoelectric conversion layer 16 provides a field in which excitons generated at the time of light absorption are separated into electrons and holes, and specifically, excitons are separated into electrons and holes at the interface (p/n junction surface) between the electron donor and the electron acceptor. The thickness of the organic photoelectric conversion layer 16 is, for example, 50 nm to 500 nm.

The upper electrode 17 is configured by an electrically-conductive film having light-transmissivity similar to that of the lower electrode 15. In the solid-state imaging element 1 using the photoelectric conversion element 10 as one pixel, the upper electrode 17 may be separated for each pixel, or may be formed as a common electrode for each pixel. The thickness of the upper electrode 17 is, for example, 10 nm to 200 nm.

It is to be noted that other layers may be provided between the organic photoelectric conversion layer 16 and the lower electrode 15 and between the organic photoelectric conversion layer 16 and the upper electrode 17. Specifically, for example, an underlying film, a hole transport layer, an electron blocking film, the organic photoelectric conversion layer 16, a hole blocking film, a buffer film, an electron transport layer, a work function adjusting film, and the like may be stacked in order from side of the lower electrode 15.

The fixed charge layer 12A may be a film having a positive fixed charge or a film having a negative fixed charge. Examples of a material of the film having a negative fixed charge include hafnium oxide, aluminum oxide, zirconium oxide, tantalum oxide, and titanium oxide. In addition, as a material other than those mentioned above, there may be used lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, an aluminum nitride film, a hafnium oxynitride film, an aluminum oxynitride film, or the like.

The fixed charge layer 12A may have a structure in which two or more types of films are stacked. This makes it possible to further enhance a function as the hole accumulation layer, for example, in a case of the film having a negative fixed charge.

A material of the dielectric layer 12B is not particularly limited, and the dielectric layer 12B is formed by, for example, a silicon oxide film, a TEOS, a silicon nitride film, a silicon oxynitride film, or the like.

An interlayer insulating layer 14 is configured by a monolayer film of one of silicon oxide, silicon nitride, silicon oxynitride (SiON), and the like, for example, or alternatively is configured by a stacked film of two or more thereof.

The protective layer 18 is configured by a material having light-transmissivity, and is configured by a monolayer film of one of silicon oxide, silicon nitride, silicon oxynitride, and the like, for example, or alternatively is configured by a stacked film of two or more thereof. The thickness of the protective layer 18 is, for example, 100 nm to 30000 nm.

The on-chip lens layer 19 is formed on the protective layer 18 to cover the entire surface thereof. A plurality of on-chip lenses (microlenses) 19L is provided on the front surface of the on-chip lens layer 19. The on-chip lens 19L condenses light incident from above on each light receiving surface of the organic photoelectric conversion section 11G and the inorganic photoelectric conversion sections 11B and 11R. In the present embodiment, the multilayer wiring line 70 is formed on the side of the second surface 11S2 of the semiconductor substrate 11, which enables the light receiving surfaces of the organic photoelectric conversion section 11G and the inorganic photoelectric conversion sections 11B and 11R to be arranged close to each other, thus making it possible to reduce variations in sensitivities between colors generated depending on a F-value of the on-chip lens 19L.

FIG. 2 is a plane view of an configuration example of a photoelectric conversion element having a pixel where a plurality of photoelectric conversion sections, to which the technology according to the present disclosure is applicable, (e.g., the above-described inorganic photoelectric conversion sections 11B and 11R and organic photoelectric conversion section 11G) are stacked. That is, FIG. 2 illustrates an example of a planar configuration of the unit pixel P constituting a pixel section 1*a* illustrated in FIG. 8, for example.

The unit pixel P includes a photoelectric conversion region 1100 in which a red photoelectric conversion section (the inorganic photoelectric conversion section 11R in FIG. 3), a blue photoelectric conversion section (the inorganic photoelectric conversion section 11B in FIG. 3), and a green photoelectric conversion section (the organic photoelectric conversion section 11G in FIG. 3) (neither of which is illustrated in FIG. 4) that perform photoelectric conversion of light of respective wavelengths of R (Red), G (Green), and B (Blue) are stacked in three layers in the order of the green photoelectric conversion section, the blue photoelectric conversion section, and the red photoelectric conversion section, for example, from side of the light receiving surface (the light incident surface Si in FIG. 3). Further, the unit pixel P includes a Tr group 1110, a Tr group 1120, and a Tr group 1130 as charge readout sections that reads charges corresponding to light of respective wavelengths of R, G, and B from the red photoelectric conversion section, the green photoelectric conversion section, and the blue photoelectric conversion section. The solid-state imaging element 1 performs, in one unit pixel P, spectroscopy in the vertical direction, i.e., spectroscopy of light of R, G, and B in respective layers as the red photoelectric conversion section, the green photoelectric conversion section, and the blue photoelectric conversion section stacked in the photoelectric conversion region 1100.

The Tr group 1110, the Tr group 1120, and the Tr group 1130 are formed on the periphery of the photoelectric conversion region 1100. The Tr group 1110 outputs, as a pixel signal, a signal charge corresponding to light of R generated and accumulated in the red photoelectric conversion section. The Tr group 1110 is configured by a transfer Tr (MOS FET) 1111, a reset Tr 1112, an amplification Tr 1113, and a selection Tr 1114. The Tr group 1120 outputs, as a pixel signal, a signal charge corresponding to light of B generated and accumulated in the blue photoelectric conversion section. The Tr group 1120 is configured by a transfer Tr 1121, a reset Tr 1122, an amplification Tr 1123, and a selection Tr 1124. The Tr group 1130 outputs, as a pixel signal, a signal charge corresponding to light of G generated and accumulated in the green photoelectric conversion section. The Tr group 1130 includes a transfer Tr 1131, a reset Tr 1132, an amplification Tr 1133, and a selection Tr 1134.

The transfer Tr 1111 is configured by (a source/drain region constituting) a gate G, a source/drain region S/D, and an FD (floating diffusion) 1115. The transfer Tr 1121 is configured by a gate G, a source/drain region S/D, and an FD 1125. The transfer Tr 1131 is configured by a gate G, (a source/drain region S/D coupled to) the green photoelectric conversion section of the photoelectric conversion region 1100, and an FD 1135. It is to be noted that the source/drain region of the transfer Tr 1111 is coupled to the red photoelectric conversion section of the photoelectric conversion region 1100, and that the source/drain region S/D of the transfer Tr 1121 is coupled to the blue photoelectric conversion section of the photoelectric conversion region 1100.

Each of the reset Trs 1112, 1132, and 1122, the amplification Trs 1113, 1133, and 1123, and the selection Trs 1114, 1134, and 1124 is configured by a gate G and a pair of source/drain regions S/D arranged to interpose the gate G therebetween.

The FDs 1115, 1135, and 1125 are coupled to the source/drain regions S/D serving as sources of the reset Trs 1112, 1132, and 1122, respectively, and are coupled to the gates G of the amplification Trs 1113, 1133 and 1123, respectively. A power supply Vdd is coupled to the common source/drain region S/D in each of the reset Tr 1112 and the amplification Tr 1113, the reset Tr 1132 and the amplification Tr 1133, and the reset Tr 1122 and the amplification Tr 1123. A VSL (vertical signal line) is coupled to each of the source/drain regions S/D serving as the sources of the selection Trs 1114, 1134, and 1124.

The technology according to the present disclosure is applicable to the above-described photoelectric conversion element.

(1-2. Method of Manufacturing Photoelectric Conversion Element)

The photoelectric conversion element 10 of the present embodiment may be manufactured, for example, as follows.

FIGS. 3 and 4 illustrate the method of manufacturing the photoelectric conversion element 10 in the order of steps. First, as illustrated in FIG. 3, the p-well 61, for example, is formed as a well of a first electrically-conductivity type in the semiconductor substrate 11, and the inorganic photoelectric conversion sections 11B and 11R of a second electrically-conductivity type (e.g., n-type) is formed in the p-well 61.

The p+ region is formed in the vicinity of the first surface 11S1 of the semiconductor substrate 11.

As illustrated in FIG. 3 as well, on the second surface 11S2 of the semiconductor substrate 11, n+ regions serving as the floating diffusions FD1 to FD3 are formed, and then, a gate insulating layer 62 and a gate wiring layer 64 including respective gates of the vertical transistor Tr1, the transfer transistor Tr2, the amplifier transistor AMP, and the reset transistor RST are formed. As a result, the vertical transistor Tr1, the transfer transistor Tr2, the amplifier transistor AMP, and the reset transistor RST are formed. Further, the multilayer wiring line 70 including the lower first contact 75, the lower second contact 76, the wiring layers 71 to 73 that include the coupling section 71A, and the insulating layer 74 is formed on the second surface 11S2 of the semiconductor substrate 11.

As a base of the semiconductor substrate 11, for example, an SOI (Silicon on Insulator) substrate is used, in which the semiconductor substrate 11, a buried oxide film (not illustrated), and a holding substrate (not illustrated) are stacked. Although not illustrated in FIG. 3, the buried oxide film and the holding substrate are joined to the first surface 11S1 of the semiconductor substrate 11. After ion implantation, anneal processing is performed.

Next, a supporting substrate (not illustrated) or another semiconductor substrate, etc. is joined to the side of the second surface 11S2 (side of the multilayer wiring line 70) of the semiconductor substrate 11, and the substrate is turned upside down. Subsequently, the semiconductor substrate 11 is separated from the buried oxide film and the holding substrate of the SOI substrate to expose the first surface 11S1 of the semiconductor substrate 11. The above steps may be performed by techniques used in common CMOS processes such as ion implantation and CVD (Chemical Vapor Deposition).

Next, as illustrated in FIG. 4, the semiconductor substrate 11 is processed from the side of the first surface 11S1 by dry-etching, for example, to form a ring-shaped opening 63H. As illustrated in FIG. 4, as for the depth, the opening 63 H penetrates from the first surface 11S1 to the second surface 11S2 of the semiconductor substrate 11, and reaches, for example, the coupling section 71A.

Next, as illustrated in FIG. 4, for example, the negative fixed charge layer 12A is formed on the first surface 11S1 of the semiconductor substrate 11 and a side surface of the opening 63H. Two or more types of films may be stacked as the negative fixed charge layer 12A. This makes it possible to further enhance the function as the hole accumulation layer. After the negative fixed charge layer 12A is formed, the dielectric layer 12B is formed.

Next, an electric conductor is buried in the opening 63H to form the through electrode 63. It is possible to use, as the electric conductor, for example, a metal material such as aluminum (Al), tungsten (W), titanium (Ti), cobalt (Co), hafnium (Hf), and tantalum (Ta), in addition to a doped silicon material such as PDAS (Phosphorus Doped Amorphous Silicon).

Subsequently, after formation of a pad section 13A on the through electrode 63, there is formed on the dielectric layer 12B and the pad section 13A, the interlayer insulating layer 14 in which the upper contact 13B and a pad section 13C that electrically couple the lower electrode 15 and the through electrode 63 (specifically, the pad section 13A on the through electrode 63) are provided on the pad section 13A.

Next, the lower electrode 15, the organic photoelectric conversion layer 16, the upper electrode 17, and the protective layer 18 are formed in this order on the interlayer insulating layer 14. The organic photoelectric conversion layer 16 is formed by, for example, the above-described three types of organic semiconducting materials by means of, for example, a vacuum deposition method. Finally, the on-chip lens layer 19 is disposed, which includes the plurality of on-chip lenses 19L on the surface thereof. Thus, the photoelectric conversion element 10 illustrated in FIG. 1 is completed.

It is to be noted that, when forming another organic layer (e.g., an electron-blocking layer, etc.) on or under the organic photoelectric conversion layer 16 as described above, it is desirable to continuously form the other organic layer (by a vacuum-consistent process) in a vacuum process. In addition, the method of forming the organic photoelectric conversion layer 16 is not necessarily limited to the method using a vacuum deposition method; another method, for example, a spin-coating technique, a printing technique, or the like may be used.

In the photoelectric conversion element 10, when light enters the organic photoelectric conversion section 11G through the on-chip lens 19L, the light passes through the organic photoelectric conversion section 11G, the inorganic photoelectric conversion sections 11B and the 11R in this order, and photoelectrically converted for each light of green, blue, and red in the passing process. Hereinafter, description is given of a signal acquisition operation of each color.

(Acquisition of Green Signal by Organic Photoelectric Conversion Section 11G)

Green light of the light having entered the photoelectric conversion element 10 is first selectively detected (absorbed) by the organic photoelectric conversion section 11G and is subjected to photoelectric conversion.

The organic photoelectric conversion section 11G is coupled to the gate Gamp of the amplifier transistor AMP and the floating diffusion FD3 via the through electrode 63. Accordingly, electrons of the electron-hole pairs generated in the organic photoelectric conversion section 11G are extracted from the side of the lower electrode 15, transferred to the side of the second surface 11S2 of the semiconductor substrate 11 via the through electrode 63, and accumulated in the floating diffusion FD3. At the same time, a charge amount generated in the organic photoelectric conversion section 11G is modulated into a voltage by the amplifier transistor AMP.

In addition, the reset gate Grst of the reset transistor RST is disposed next to the floating diffusion FD3. As a result, the charges accumulated in the floating diffusion FD3 are reset by the reset transistor RST.

Here, the organic photoelectric conversion section 11G is coupled not only to the amplifier transistor AMP but also to the floating diffusion FD3 via the through electrode 63, thus making it possible to easily reset the charges accumulated in the floating diffusion FD3 by the reset transistor RST.

On the other hand, in a case where the through electrode 63 and the floating diffusion FD3 are not coupled to each other, it is difficult to reset the charges accumulated in the floating diffusion FD3, thus resulting in application of a large voltage to pull out the charges to the side of the upper electrode 17. Accordingly, there is a possibility that the organic photoelectric conversion layer 16 may be damaged. In addition, the structure that enables resetting in a short period of time leads to an increase in dark noises, resulting in a trade-off, which structure is thus difficult.

(Acquisition of Blue Signal and Red Signal by Inorganic Photoelectric Conversion Sections 11B and 11R)

Subsequently, among the light transmitted through the organic photoelectric conversion section 11G, blue light and red light are sequentially absorbed by the inorganic photoelectric conversion section 11B and the inorganic photoelectric conversion section 11R, respectively, and are subjected to photoelectric conversion. In the inorganic photoelectric conversion section 11B, electrons corresponding to the incident blue light are accumulated in an n-region of the inorganic photoelectric conversion section 11B, and the accumulated electrons are transferred to the floating diffusion FD1 by the vertical transistor Tr1. Similarly, in the inorganic photoelectric conversion section 11R, electrons corresponding to the incident red light are accumulated in an n-region of the inorganic photoelectric conversion section 11R, and the accumulated electrons are transferred to the floating diffusion FD2 by the transfer transistor Tr2.

(1-3. Workings and Effects)

An organic photoelectric conversion film used in a vertical spectroscopic imaging element which has been proposed in recent years is required to have spectral characteristics of absorbing only light of a desired wavelengths, high photoelectric conversion characteristics, low dark current characteristics, and high-speed response (on/off) characteristics.

As a method for improving the above-described electric characteristics, it has been reported that a quinacridone derivative and a subphthalocyanine derivative and transparent compounds which do not absorb visible light are used as materials of the photoelectric conversion film, as described above. In addition, for example, a method of using a P material having transmissivity to visible light as a carrier transporting material, a method of configuring a photoelectric conversion film using a total of three types of materials, i.e., a material that selectively absorbs light in a predetermined wavelength region and two respective types of materials that transport electrons and holes, and other methods are conceived.

Meanwhile, in the present embodiment, the photoelectric conversion layer is formed using at least one of the ChDT1 derivative represented by the above general formula (1) or the ChDT2 derivative represented by the above general formula (2). The charges (particularly, holes) generated in the organic photoelectric conversion layer 16 are transported in the stacking direction, for example, to the side of the upper electrode 17, via the mother skeletons of the ChDT1 derivative and the ChDT2 derivative stacked from the lower electrode 15 toward the upper electrode 17 in the organic photoelectric conversion layer 16. As for the ChDT1 derivative and the ChDT2 derivative in the organic photoelectric conversion layer 16, a molecular structure of the mother skeleton tends to be oriented in a horizontal direction (Face-On) with respect to the semiconductor substrate 11, thereby allowing for higher hole mobility. Specifically, the ChDT1 derivative has a hole mobility of, for example, 9.0E-4 $cm^2$/V at −2.6 V. For example, the ChDT1 derivative has the following characteristics as compared with other materials having hole transporting properties (e.g., pentacene).

FIG. 5A illustrates a structure of the mother skeleton parts of the two stacked ChDT1 derivatives in a planar direction (X-Y plane). FIG. 5B illustrates a structure of the mother skeleton parts of the two stacked ChDT1 derivatives in the stacking direction (Z-axis direction). Here, a major axis direction of a molecule is defined as the X-axis, a minor axis direction of the molecule is defined as the Y-axis, and an axis orthogonal to a plane (X-Y plane) formed by the X-axis and the Y-axis is defined as the Z-axis. rx (Å) is deviation of the centers of gravity of two molecules in the major axis direction stacked in the Z-axis direction, and rz (Å) is a distance in the molecular plane between the two molecules stacked in the Z-axis direction. FIG. 6 illustrates a relationship between the charge transfer integral and the deviation (rx (Å)) of the centers of gravity in the major axis direction of two molecules of the ChDT1 and the pentacene stacked in the Z-axis direction. The pentacene has a large change in the charge transfer integral due to a change in the rx (Å) and large anisotropy in hole mobility. Meanwhile, the ChDT1 has a small change in charge transfer integral due to the change in the rx (Å), and small anisotropy in charge mobility. That is, this means that the ChDT1 has low decay in the charge transfer integral of the charge (hole) even when the mother skeleton deviates in the major axis direction of the molecule in the organic photoelectric conversion layer 16. This enables the ChDT1 derivative to transport the charges (holes) generated in the organic photoelectric conversion layer 16 toward the upper electrode 17 more stably than other materials having hole transporting properties.

As described above, in the photoelectric conversion element 10 of the present embodiment, the organic photoelectric conversion layer 16 is formed by using at least one of the ChDT1 derivative represented by the above general formula (1) or the ChDT2 derivative represented by the above general formula (2) which do not perform absorption in the visible-light region, thus making it possible to improve the transporting performance of charges generated by photoelectric conversion without influencing the spectral characteristics. Thus, it is possible to improve the electric characteristics of the photoelectric conversion element 10 and the solid-state imaging element 1 including the photoelectric conversion element 10. Specifically, it is possible to improve external quantum efficiency (External Quantum Efficiency; EQE) and responsiveness as well as to ameliorate dark current characteristics. The same applies also to the ChDT2 derivative.

Next, description is given of a modification example of the present disclosure. It is to be noted that components corresponding to those of the photoelectric conversion element 10 of the foregoing embodiment are denoted by the same reference numerals, and descriptions thereof are omitted.

2. MODIFICATION EXAMPLES

FIG. 7 illustrates a cross-sectional configuration of a photoelectric conversion element (a photoelectric conversion element 20) according to a modification example of the present disclosure. The photoelectric conversion element 20 configures, for example, one unit pixel P in the solid-state imaging element (the solid-state imaging element 1) such as a backside illumination type CCD image sensor or a CMOS image sensor, similarly to the photoelectric conversion element 10 of the foregoing embodiment, etc. The photoelectric conversion element 20 of the present modification example has a configuration in which a red photoelectric conversion section 40R, a green photoelectric conversion section 40G, and a blue photoelectric conversion section 40B are stacked in this order on a silicon substrate 81, with the insulating layer 82 interposed therebetween.

The red photoelectric conversion section 40R, the green photoelectric conversion section 40G and the blue photoelectric conversion section 40B include organic photoelectric conversion layers 42R, 42G, and 42B between a pair of electrodes, specifically, between a first electrode 41R and a second electrode 43R, between a first electrode 41G and a second electrode 43G, and between a first electrode 41B and a second electrode 43B, respectively. The organic photoelectric conversion layers 42R, 42G, and 42B each include the ChDT1 derivative represented by the above general formula (1) or the ChDT2 derivative represented by the above general formula (2), thus making it possible to achieve effects similar to those of the foregoing embodiment.

As described above, the photoelectric conversion element 20 has a configuration in which the red photoelectric conversion section 40R, the green photoelectric conversion section 40G, and the blue photoelectric conversion section 40B are stacked in this order on the silicon substrate 81, with the insulating layer 82 interposed therebetween. The on-chip lens 19L is provided on the blue photoelectric conversion section 40B, with the protective layer 18 and the on-chip lens layer 19 interposed therebetween. A red electricity storage layer 210R, a green electricity storage layer 210G, and a blue electricity storage layer 210B are provided in the silicon substrate 81. The light incident on the on-chip lens 19L is subjected to photoelectric conversion at the red photoelectric conversion section 40R, the green photoelectric conversion section 40G, and the blue photoelectric conversion section 40B. Respective signal charges are transmitted from the red photoelectric conversion section 40R to the red electricity storage layer 210R, from the green photoelectric conversion section 40G to the green electricity storage layer 210G, and from the blue photoelectric conversion section 40B to the blue electricity storage layer 210B. Although the signal charges may be either electrons or holes generated by photoelectric conversion, in the following, description is given by exemplifying a case where electrons are read as signal charges.

The silicon substrate 81 is configured by, for example, a p-type silicon substrate. The red electricity storage layer 210R, the green electricity storage layer 210G, and the blue electricity storage layer 210B provided in the silicon substrate 81 each include an n-type semiconductor region, and signal charges (electrons) supplied from the red photoelectric conversion section 40R, the green photoelectric conversion section 40G, and the blue photoelectric conversion section 40B are accumulated in the n-type semiconductor region. The n-type semiconductor regions of the red electricity storage layer 210R, the green electricity storage layer 210G, and the blue electricity storage layer 210B are formed, for example, by doping the silicon substrate 81 with an n-type impurity such as phosphorus (P) or arsenic (As).

It is to be noted that the silicon substrate 81 may be provided on a supporting substrate (not illustrated) of glass, or the like.

The silicon substrate 81 includes a pixel transistor for reading electrons from each of the red electricity storage layer 210R, the green electricity storage layer 210G, and the blue electricity storage layer 210B and for transferring the read electrons to, for example, a vertical signal line (a vertical signal line Lsig in FIG. 8 described later). A floating diffusion of the pixel transistor is provided in the silicon substrate 81, and the floating diffusion is coupled to the red electricity storage layer 210R, the green electricity storage layer 210G, and the blue electricity storage layer 210B. The floating diffusion is configured by the n-type semiconductor region.

The insulating layer 82 is configured by, for example, silicon oxide, silicon nitride, silicon oxynitride, hafnium oxide, or the like. The insulating layer 82 may be configured by stacking a plurality of types of insulating films. The insulating layer 82 may be configured by an organic insulating material. The insulating layer 82 includes respective plugs and respective electrodes for coupling the red electricity storage layer 210R and the red photoelectric conversion section 40R, the green electricity storage layer 210G and the green photoelectric conversion section 40G, and the blue electricity storage layer 210B and the blue photoelectric conversion section 40B.

The red photoelectric conversion section 40R includes the first electrode 41R, an organic photoelectric conversion layer 42R, and the second electrode 43R in this order from a position close to the silicon substrate 81. The green photoelectric conversion section 40G includes the first electrode 41G, an organic photoelectric conversion layer 42G, and the second electrode 43G in this order from a position close to the red photoelectric conversion section 40R. The blue photoelectric conversion section 40B includes the first electrode 41B, an organic photoelectric conversion layer 42B, and the second electrode 43B in this order from a position close to the green photoelectric conversion section 40G. An insulating layer 44 is provided between the red photoelectric conversion section 40R and the green photoelectric conversion section 40G, and an insulating layer 45 is provided between the green photoelectric conversion section 40G and the blue photoelectric conversion section 40B. Light of red (e.g., a wavelength in a range equal to or more than 600 nm and less than 700 nm) is selectively absorbed in the red photoelectric conversion section 40R; light of green (e.g., a wavelength in a range equal to or more than 480 nm and less than 600 nm) is selectively absorbed in the green photoelectric conversion section 40G; and light of blue (e.g., a wavelength in a range equal to or more than 400 nm and less than 480 nm) is selectively absorbed in the blue photoelectric conversion section 40B, thus allowing for generation of electron-hole pairs.

The first electrode 41R extracts signal charges generated in the organic photoelectric conversion layer 42R; the first electrode 41G extracts signal charges generated in the organic photoelectric conversion layer 42G; and the first electrode 41B extracts signal charges generated in the organic photoelectric conversion layer 42B. The first electrodes 41R, 41G, and 41B are each provided for each pixel, for example. The first electrodes 41R, 41G, and 41B are each configured by, for example, a light-transmissive electrically-conductive material, specifically, ITO. The first electrodes 41R, 41G, and 41B may be each configured by, for example, a tin oxide-based material or a zinc oxide-based material. The tin oxide-based material is obtained by doping tin oxide with a dopant. Examples of the zinc oxide-based material include aluminum zinc oxide in which zinc oxide is doped with aluminum as a dopant, gallium zinc oxide in which zinc oxide is doped with gallium as a dopant, and indium zinc oxide in which zinc oxide is doped with indium as a dopant. Alternatively, IGZO, CuI, InSbO$_4$, ZnMgO, CuInO$_2$, MgIn$_2$O$_4$, CdO, ZnSnO$_3$, or the like may be used. The thickness of each of the first electrodes 41R, 41G, and 41B is, for example, 50 nm to 500 nm.

For example, an electron transport layer may be provided between the first electrode 41R and the organic photoelectric conversion layer 42R, between the first electrode 41G and the organic photoelectric conversion layer 42G, and between the first electrode 41B and the organic photoelectric conversion layer 42B. The electron transport layer serves to promote supplying of electrons generated in the organic photoelectric conversion layers 42R, 42G, and 42B to the first electrodes 41R, 41G, and 41B, respectively, and is configured by, for example, titanium oxide, zinc oxide, or the like. The electron transport layer may be configured by stacking titanium oxide and zinc oxide. The thickness of the electron transport layer is, for example, 0.1 nm to 1000 nm, and preferably 0.5 nm to 300 nm.

The organic photoelectric conversion layers 42R, 42G, and 42B each absorb light in a selective wavelength region for photoelectric conversion, and transmit light in another wavelength region. Here, the light in the selective wavelength region is, for example, light in a wavelength region in a range equal to or more than 600 nm and less than 700 nm in the organic photoelectric conversion layer 42R, light in a wavelength region in a range equal to or more than 480 nm and less than 600 nm in the organic photoelectric conversion layer 42G, and light in a wavelength region in a range equal to or more than 400 nm and less than 480 nm in the organic photoelectric conversion layer 42B. The thickness of each of the organic photoelectric conversion layers 42R, 42G, and 42B is, for example, in a range from 50 nm to 500 nm.

The organic photoelectric conversion layers 42R, 42G, and 42B each include, for example, two or more types of organic semiconductor materials, and preferably includes, for example, one or both of a p-type semiconductor and an n-type semiconductor, similarly to the organic photoelectric conversion layer 16 in the foregoing embodiment. For example, one of the p-type semiconductor and the n-type semiconductor is preferably a material having transmissivity to visible light, and the other is preferably a material that performs photoelectric conversion of light in a selective wavelength region (e.g., in a range from 450 nm to 650 nm). In the present modification example, the p-type semiconductor includes one or more of the ChDT1 derivative represented by the above general formula (1) or the ChDT2 derivative represented by the above general formula (2).

It is preferable to use, as the organic photoelectric conversion layers 42R, 42G, and 42B, a material (light absorber) that enables photoelectric conversion of light in the above-described selective wavelength region, in addition to the ChDT1 derivative or the ChDT2 derivative. This enables selective photoelectric conversion of red light in the organic photoelectric conversion layer 42R, green light in the organic photoelectric conversion layer 42G, and blue light in the organic photoelectric conversion layer 42B. Examples of such a material include subnaphthalocyanine represented by the following general formula (14) or a derivative thereof and phthalocyanine represented by the following general formula (15) or a derivative thereof in the organic photoelectric conversion layer 42R. In the organic photoelectric conversion layer 42G, examples thereof include subphthalocyanine represented by the general formula (11) in the foregoing embodiment or a derivative thereof. In the organic photoelectric conversion layer 42B, examples thereof include coumarin represented by the following general formula (16) or a derivative thereof and porphyrin represented by the following general formula (17) or a derivative thereof.

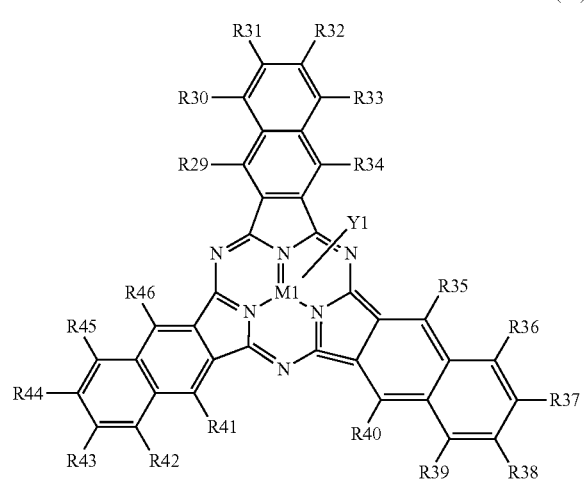

(14)

(R29 to R46 are, each independently, selected from the group consisting of a hydrogen atom, a halogen atom, a linear, branched, or cyclic alkyl group, a thioalkyl group, a thioaryl group, an aryl sulfonyl group, an alkyl sulfonyl group, an amino group, an alkylamino group, an aryl amino group, a hydroxy group, an alkoxy group, an acylamino group, an acyloxy group, a phenyl group, a carboxy group, a carboxamide group, a carboalkoxy group, an acyl group, a sulfonyl group, a cyano groups, and a nitro group, and any adjacent R29 to R46 may be a portion of a condensed aliphatic ring or a condensed aromatic ring. The condensed aliphatic ring or the condensed aromatic ring may contain one or more atoms other than carbon. M1 denotes boron or divalent or trivalent metal. Y1 denotes any substituent selected from the group consisting of halogen, a hydroxy group, a thiol group, an imide group, a substituted or unsubstituted alkoxy group, a substituted or unsubstituted aryloxy group, a substituted or unsubstituted alkyl group, a substituted or unsubstituted alkylthio group, and a substituted or unsubstituted arylthio group).

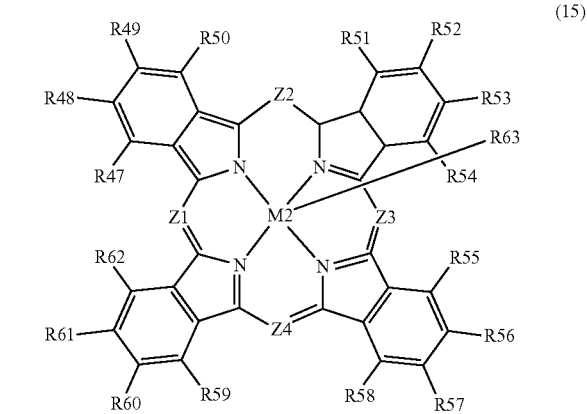

(15)

(R47 to R62 denote, each independently, a hydrogen atom, a halogen atom, a linear, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyl oxy group, a carboxyl group, a carboxamide group, a carboalkoxy group, an acyl group, a sulfonyl group, a cyano group, and a nitro group.

Any adjacent R47 to R62 may be bonded together to form a condensed aliphatic ring or condensed aromatic ring. The condensed aliphatic ring or the condensed aromatic ring may contain one or more atoms other than carbon. Z1 to Z4 denote, each independently, a nitrogen atom. R63 denotes a hydrogen atom, a halogen atom, a linear, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyl oxy group, a carboxyl group, a carboxamide group, a carboalkoxy group, an acyl group, a sulfonyl group, a cyano group, and a nitro group. M2 denotes boron or divalent or trivalent metal.)

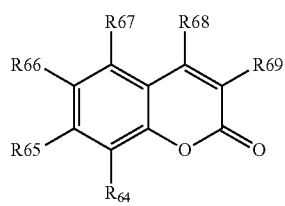

(16)

(R64 to R69 denote, each independently, a hydrogen atom, a halogen atom, a linear, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyl oxy group, a carboxyl group, a carboxamide group, a carboalkoxy group, an acyl group, a sulfonyl group, a cyano group, and a nitro group.

Any adjacent R64 to R69 may be bonded together to form a condensed aliphatic ring or condensed aromatic ring. The condensed aliphatic ring or the condensed aromatic ring may contain one or more atoms other than carbon.)

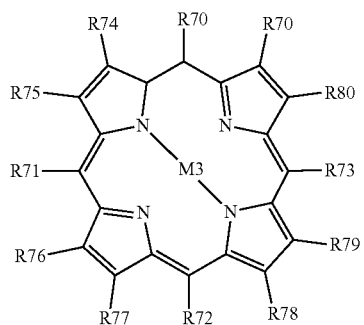

(17)

(R70 to R81 denote, each independently, a hydrogen atom, a halogen atom, a linear, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyl oxy group, a carboxyl group, a carboxamide group, a carboalkoxy group, an acyl group, a sulfonyl group, a cyano group, and a nitro group.

Any adjacent R70 to R81 may be bonded together to form a condensed aliphatic ring or condensed aromatic ring. The condensed aliphatic ring or the condensed aromatic ring may contain one or more atoms other than carbon. M3 denotes metal, a metal halide, a metal oxide, a metal hydride, or two hydrogens.)

It is preferable to use, as the organic photoelectric conversion layers 42R, 42G, and 42B, the C60 fullerene represented by the above general formula (12) or a derivative thereof, or the C70 fullerene represented by the above general formula (13) or a derivative thereof. The use of at least one of the fullerene 60 or the fullerene 70 or a derivative thereof makes it possible to further improve photoelectric conversion efficiency and to reduce a dark current.

It is to be noted that the ChDT1 or the ChDT2 derivative, subphthalocyanine or a derivative thereof, naphthalocyanine or a derivative thereof, and fullerene or a derivative thereof function as a p-type semiconductor or an n-type semiconductor depending on a material to be combined.

For example, a hole transport layer may be provided between the organic photoelectric conversion layer 42R and the second electrode 43R, between the organic photoelectric conversion layer 42G and the second electrode 43G, and between the organic photoelectric conversion layer 42B and the second electrode 43B. The hole transport layer serves to promote supplying of holes generated in the organic photoelectric conversion layers 42R, 42G, and 42B to the second electrodes 43R, 43G, and 43B, respectively, and is configured by, for example, molybdenum oxide, nickel oxide, vanadium oxide, or the like. The hole transport layer may be configured by an organic material such as PEDOT (Poly(3,4-ethylenedioxythiophene) and TPD (N,N'-Bis(3-methylphenyl)-N,N'-diphenylbenzidine). The thickness of the hole transport layers is, for example, in a range from 0.5 nm to 100 nm.

The second electrode 43R serves to extract holes generated in the organic photoelectric conversion layer 42R; the second electrode 43G serves to extract holes generated in the organic photoelectric conversion layer 42G; and the second electrode 43B serves to extract holes generated in the organic photoelectric conversion layer 42G. The holes extracted from the second electrodes 43R, 43G, and 43B are discharged to, for example, a p-type semiconductor region (not illustrated) in the silicon substrate 81 via respective transmission paths (not illustrated). The second electrodes 43R, 43G, and 43B are each configured by, for example, an electrically-conductive material such as gold, silver, copper, and aluminum. Similarly to the first electrodes 41R, 41G, and 41B, the second electrodes 43R, 43G, and 43B may be each configured by a transparent electrically-conductive material. In the photoelectric conversion element 20, holes extracted from the second electrodes 43R, 43G, and 43B are discharged. Therefore, for example, when a plurality of photoelectric conversion elements 20 is arranged in the solid-state imaging element 1 described later, the second electrodes 43R, 43G, and 43B may be provided in common for each of the photoelectric conversion elements 20 (unit pixel P). The thickness of each of the second electrodes 43R, 43G, and 43B is, for example, in a range from 0.5 nm to 100 nm.

The insulating layer 44 serves to insulate the second electrode 43R and the first electrode 41G from each other, and the insulating layer 45 serves to insulate the second electrode 43G and the first electrode 41B from each other. The insulating layers 44 and 45 are each configured by, for example, a metal oxide, a metal sulfide, or an organic material. Examples of the metal oxide include silicon oxide, aluminum oxide, zirconium oxide, titanium oxide, zinc oxide, tungsten oxide, magnesium oxide, niobium oxide, tin oxide, and gallium oxide. Examples of the metal sulfide include zinc sulfide and magnesium sulfide. The band gap of a constituent material of each of the insulating layers 44 and 45 is preferably 3.0 eV or more. The thickness of each of the insulating layers 44 and, 45 is, for example, in a range from 2 nm to 100 nm.

As described above, configuring the organic photoelectric conversion layer 42R (42G and 42B) to each include the ChDT1 derivative or the ChDT2 derivative makes it possible to quickly perform separation of excitons generated due to light absorption into carriers and movement thereof to the electrodes, similarly to the foregoing embodiment. Thus, it becomes possible to improve photoelectric conversion efficiency.

3. APPLICATION EXAMPLES

Application Example 1

FIG. 8 illustrates, for example, an overall configuration of the solid-state imaging element 1 (solid-state imaging device) in which the photoelectric conversion element 10 described in the foregoing embodiment is used for each pixel. The solid-state imaging element 1 is a CMOS imaging sensor. The solid-state imaging element 1 has a pixel section 1a as an imaging area on the semiconductor substrate 11, and includes, for example, a peripheral circuit section 130 configured by a row scanning section 131, a horizontal selection section 133, a column scanning section 134, and a system control section 132 in a peripheral region of the pixel section 1a.

The pixel section 1a includes, for example, a plurality of unit pixels P (corresponding to, e.g., photoelectric conversion elements 10) that are arranged two-dimensionally in matrix. To the unit pixels P, for example, pixel drive lines Lread (specifically, row selection lines and reset control lines) are wired on a pixel-row basis, and vertical signal lines Lsig are wired on a pixel-column basis. The pixel drive line Lread transmits a drive signal for reading of a signal from the pixel. One end of the pixel drive line Lread is coupled to an output terminal corresponding to each row in the row scanning section 131.

The row scanning section 131 is configured by a shift register, an address decoder, etc. The row scanning section 131 is, for example, a pixel drive section that drives the respective unit pixels P in the pixel section 1a on a row-unit basis. Signals outputted from the respective unit pixels P in the pixel row selectively scanned by the row scanning section 131 are supplied to the horizontal selection section 133 via the respective vertical signal lines Lsig. The horizontal selection section 133 is configured by an amplifier, a horizontal selection switch, etc., that are provided for each vertical signal line Lsig.

The column scanning section 134 is configured by a shift register, an address decoder, etc. The column scanning section 134 sequentially drives the respective horizontal selection switches in the horizontal selection section 133 while scanning the respective horizontal selection switches in the horizontal selection section 133. As a result of the selective scanning by the column scanning section 134, signals of the respective pixels to be transmitted via the respective vertical signal lines Lsig are sequentially outputted to horizontal signal lines 135, and are transmitted to the outside of the semiconductor substrate 11 through the horizontal signal lines 135.

A circuit part configured by the row scanning section 131, the horizontal selection section 133, the column scanning section 134, and the horizontal signal lines 135 may be formed directly on the semiconductor substrate 11, or may be arranged in an external control IC. Alternatively, the circuit part may be formed on another substrate coupled with use of a cable, etc.

The system control section 132 receives a clock, data instructing an operation mode, etc., that are supplied from the outside of the semiconductor substrate 11. The system control section 132 also outputs data such as internal information of the solid-state imaging element 1. The system control section 132 further includes a timing generator that generates various timing signals, and performs drive control of peripheral circuits such as the row scanning section 131, the horizontal selection section 133, and the column scanning section 134 on the basis of the various timing signals generated by the timing generator.

Application Example 2

The above-described solid-state imaging element 1 is applicable to any type of the solid-state imaging device (electronic apparatus) having an imaging function, for example, a camera system such as a digital still camera and a video camera, and a mobile phone having the imaging function. FIG. 9 illustrates an outline configuration of a camera 2 as an example thereof. This camera 2 is, for example, a video camera that is able to photograph a still image or shoot a moving image. The camera 2 includes, for example, the solid-state imaging element 1, an optical system (optical lens) 310, a shutter device 311, a drive section 313 that drives the solid-state imaging element 1 and the shutter device 311, and a signal processing section 312.

The optical system 310 guides image light (incident light) from a subject to the pixel section 1a in the solid-state imaging element 1. The optical system 310 may be configured by a plurality of optical lenses. The shutter device 311 controls periods of light irradiation and light shielding with respect to the solid-state imaging element 1. The drive section 313 controls a transfer operation of the solid-state imaging element 1 and a shutter operation of the shutter device 311. The signal processing section 312 performs various types of signal processing on a signal outputted from the solid-state imaging element 1. An image signal Dout after the signal processing is stored in a storage medium such as a memory, or outputted to a monitor, etc.

Application Example 3

<Example of Practical Application to In-Vivo Information Acquisition System>

Further, the technology according to an embodiment of the present disclosure (present technology) is applicable to various products. For example, the technology according to an embodiment of the present disclosure may be applied to an endoscopic surgery system.

FIG. 10 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 10, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

Application Example 4

<4. Example of Practical Application to Endoscopic Surgery System>

The technology according to an embodiment of the present disclosure (present technology) is applicable to various products. For example, the technology according to an embodiment of the present disclosure may be applied to an endoscopic surgery system.

FIG. 11 is a view depicting an example of a schematic configuration of an endoscopic surgery system to which the technology according to an embodiment of the present disclosure (present technology) can be applied.

In FIG. 11, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 12 is a block diagram depicting an example of a functional configuration of the camera head 11102 and the CCU 11201 depicted in FIG. 11.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

Application Example 5

<Example of Practical Application to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

4. WORKING EXAMPLE

Next, description is given in detail of a working example of the present disclosure.

(Experiment 1: Evaluation of Energy Levels of ChDT1 Derivative and ChDT2 Derivative)

In order to evaluate energy levels of the ChDT1 derivative, the ChDT2 derivative, and other materials, a vapor deposition equipment was used to form an organic thin film 412 having a thickness of 50 nm on a silicon substrate 411 (FIG. 15). In Experiment 1, the ChDT1 represented by the formula (1-1), the BP-ChDT1 represented by the formula (1-3), the DP-ChDT1 represented by the formula (1-2), and the BP-ChDT2 represented by the formula (2-3) were used as the ChDT1 derivative and the ChDT2 derivative. As other materials, the $F_6$-SubPc-$OC_6F_5$ represented by the following formula (11-1) and the C60 represented by the following formula (12-1) were used. The HOMO level of each of these materials was evaluated by ultraviolet photoelectron spectroscopy (UPS). The LUMO level thereof was obtained by calculation of an optical band gap from results of spectroscopic measurement and calculation from the optical band gap and the HOMO level calculated by the UPS. The HOMO values and the LUMO values of the respective materials thus obtained are summarized in Table 1 set forth above.

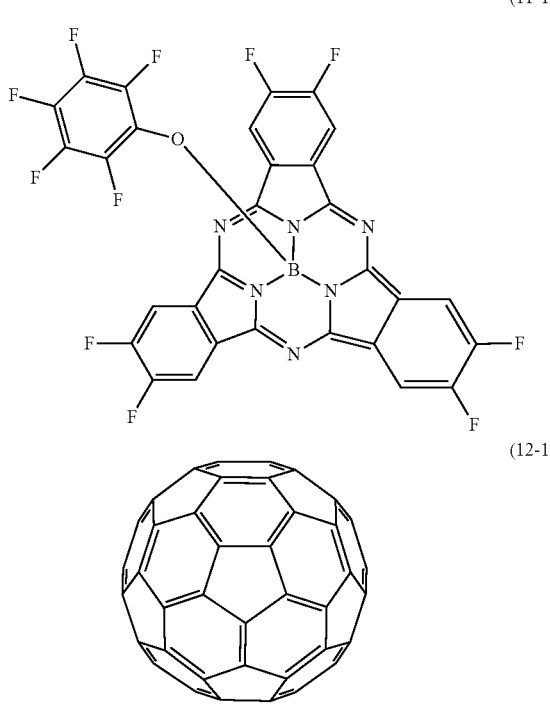

(11-1)

(12-1)

(Experiment 2: Evaluation of Spectral Characteristics of ChDT1 Derivative and ChDT2 Derivative)

In order to evaluate spectral characteristics of the ChDT1 derivative and the ChDT2 derivative, the vapor deposition equipment was used to form the organic thin film 412 having a thickness of 50 nm on a quartz substrate 410 (FIG. 16). In Experiment 2, the ChDT1 represented by the formula (1-1), the BP-ChDT1 represented by the formula (1-3), the DP-ChDT1 represented by the formula (1-2), and the BP-ChDT2 represented by the formula (2-3) were used as the ChDT1 derivative and the ChDT2 derivative. The spectral characteristics of the respective materials were measured using an ultraviolet-visible spectrophotometer. FIG. 17 illustrates the spectral characteristics of the ChDT1, the BP-ChDT1, the DP-ChDT1 and the BP-ChDT2. It was appreciated that neither the ChDT1, the BP-ChDT1, the DP-ChDT1 nor the BP-ChDT2 absorbed substantially any visible light.

(Experimental 3: Electric Characteristics of Bulk Hetero Structure Using ChDT1 Derivative and ChDT2 Derivative)

First, a photoelectric conversion element using the BP-ChDT1 was produced as a p-type semiconductor material (p-material). An ITO electrode was formed as a lower electrode 415 on the quartz substrate 410, and UV/ozone ($O_3$) washing was performed. Thereafter, the quartz substrate 410 was moved to an organic vapor deposition chamber, and the chamber was depressurized to $1 \times 10^{-5}$ Pa or less. Subsequently, while rotating a substrate holder, a sublimation-purified BP-ChDT1 (formula (1-3)), a sublimation-purified $F_6$-SubPc-$OC_6F_5$ (formula (11-1)), and a sublimation-purified C60 (formula (12-1)) were vapor-deposited on the lower electrode 415 to have a total of 100 nm by adjusting a vapor-deposition rate to obtain a ratio of BP-ChDT1:$F_6$-SubPc-$OC_6F_5$:C60=4:4:2, thus forming an organic photoelectric conversion layer 416 having a bulk hetero structure. Then, B4PyMPM represented by the following formula (18) was formed to have a thickness of 5 nm as a buffer layer 420. Subsequently, an Al—Si—Cu alloy was vapor-deposited to have a thickness of 100 nm as an upper electrode 417, thereby producing a photoelectric conversion element (Experimental Example 1) having a photoelectric conversion region of 1 mm×1 mm (FIG. 18).

In addition, photoelectric conversion elements (Experimental Examples 2 to 6) were produced using methods similar to that in Experimental Example 1 described above except that the p-material was changed from the BP-ChDT1 to the DP-ChDT1 (formula (1-2); Experimental Example 2), to the BP-ChDT2 (formula (2-3); Experimental Example 3), to BP-DTT (formula (19); Experimental Example 4), to BP-1T (formula (20); Experimental Example 5), and to BP-2T (formula (21); Experimental Example 6).

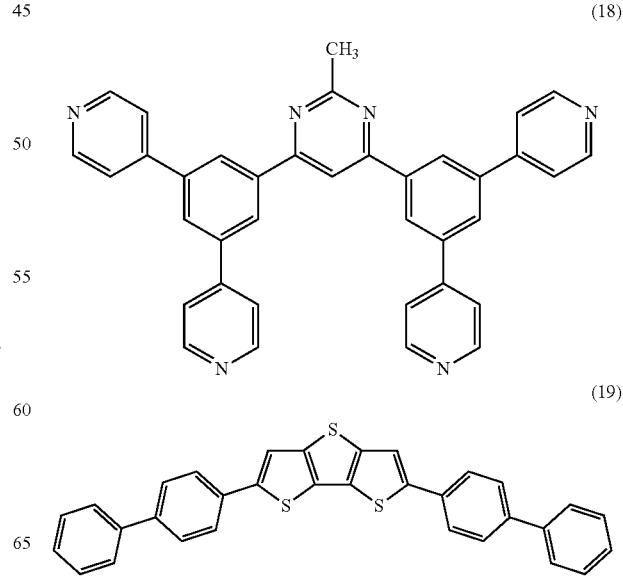

(18)

(19)

-continued

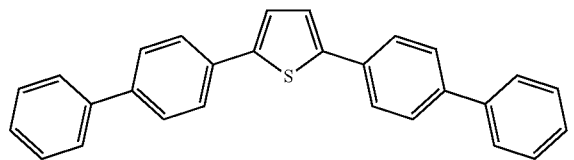
(20)

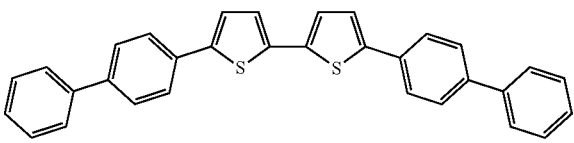
(21)

External quantum efficiencies (EQE) and dark current characteristics of Experimental Examples 1 to 6 were evaluated using a semiconductor parameter analyzer. Specifically, external photoelectric conversion efficiencies were calculated from a bright current value and a dark current value in a case where an amount of light (LED light having a wavelength of 560 nm) to be irradiated from the light source to the photoelectric conversion element via a filter was set to 1.62 μW/cm$^2$ and where a bias voltage to be applied between electrodes was set to −2.6 V. The responsiveness was evaluated by measuring a rate at which the bright current value observed at the time of light irradiation fell after the light irradiation was stopped using the semiconductor parameter analyzer. Specifically, the amount of light to be irradiated from the light source to the photoelectric conversion element via the filter was set to 1.62 μW/cm$^2$, and the bias voltage to be applied between the electrodes was set to −2.6 V. After a steady current was observed in this state, the light irradiation was stopped and the current was observed to decay. Subsequently, an area surrounded by the current-time curve and the dark current was set to 100%, and time until the area decayed to 3% was used as an index of the responsiveness. FIG. 19 illustrates the EQE of each of Experimental Example 1 to Experimental Example 3. FIG. 20 illustrates dark current characteristics of each of Experimental Example 1 to Experimental Example 3. FIG. 21 illustrates the responsiveness of each of Experimental Example 1 to Experimental Example 3. Table 2 summarizes the p-materials used in Experimental Examples 1 to 6 and their respective electric characteristics (EQE, dark current, and responsiveness).

TABLE 2

| | P-Material | EQE (%) | Dark Current (A/cm$^2$) | Responsiveness (ms) |
|---|---|---|---|---|
| Experimental Example 1 | BP-ChDT1 | 85.1 | 7.90E−12 | 0.16 |
| Experimental Example 2 | DP-ChDT1 | 74.5 | 1.59E−11 | 4.5 |
| Experimental Example 3 | BP-ChDT2 | 86.6 | 2.10E−11 | 0.49 |
| Experimental Example 4 | BP-DTT | 94 | 3.00E−09 | 33 |
| Experimental Example 5 | BP-1T | 69 | 2.00E−09 | 500 |
| Experimental Example 6 | BP-2T | 90 | 1.80E−09 | 79.3 |

The following was found from Table 2 and FIGS. 19, 20, and 21. First, in Experimental Example 1 using the BP-ChDT1 as the p-material and in Experimental Example 3 using the BP-ChDT2, EQEs of the same degree were obtained as compared with Experimental Examples 4 and 6 using BP-DTT and BP-2T, respectively. In addition, as compared with Experimental Examples 4 and 6 and Experimental Example 5 using the BP-1T as the p-material, in Experimental Example 1, the dark current characteristics were greatly ameliorated, and the responsiveness was greatly improved. In addition, the responsiveness was also greatly improved in Experimental Example 3.

Description has been given hereinabove referring to the embodiment, the modification example, and the working examples; however, the content of the present disclosure is not limited to the foregoing embodiment and the like, and various modifications may be made. For example, in the foregoing embodiment, the photoelectric conversion element has a configuration in which the organic photoelectric conversion section 11G that detects green light, and the inorganic photoelectric conversion section 11B and the inorganic photoelectric conversion section 11R that detect blue light and red light, respectively, are stacked. However, the content of the present disclosure is not limited to such a structure. In other words, red light or blue light may be detected in the organic photoelectric conversion section, and green light may be detected in the inorganic photoelectric conversion section.

Further, the numbers of these organic photoelectric conversion section and inorganic photoelectric conversion section, and the ratio therebetween are not limitative. Two or more organic photoelectric conversion sections may be provided, or color signals of a plurality of colors may be obtained only by the organic photoelectric conversion sections. Furthermore, the organic photoelectric conversion section and the inorganic photoelectric conversion section are not limited to have a stacked structure in the vertical direction, and may be arranged side by side along the substrate surface.

Moreover, the foregoing embodiment, etc. exemplifies the configuration of the backside illumination type solid-state imaging device; however, the content of the present disclosure is also applicable to a solid-state imaging device of a front surface illumination type. Further, the photoelectric conversion element of the present disclosure does not necessarily include all of the components described in the foregoing embodiment, and may include any other layer, conversely.

It is to be noted that the effects described herein are merely exemplary and are not limitative, and may further include other effects.

It is to be noted that the present disclosure may have the following configurations.

[1]

A photoelectric conversion element including:

a first electrode;

a second electrode disposed to be opposed to the first electrode; and an organic photoelectric conversion layer provided between the first electrode and the second electrode and including at least one of a Chryseno[1,2-b:8,7-b']dithiophene (ChDT1) derivative represented by the following general formula (1) or a Chryseno[1,2-b:7,8-b']dithiophene (ChDT2) derivative represented by the following general formula (2).

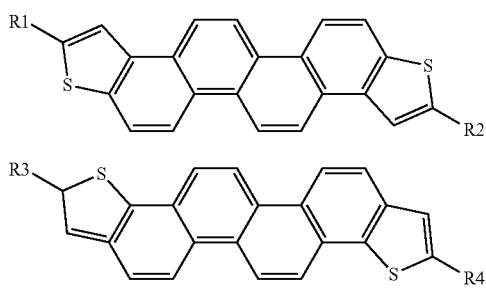

(1)

(2)

(R1 to R4 denote, each independently, a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof.)

[2]

The photoelectric conversion element according to [1], in which the organic photoelectric conversion layer further includes an organic semiconductor material having a maximum absorption wavelength on side of a longer wavelength than 450 nm.

[3]

The photoelectric conversion element according to [2], in which the organic semiconductor material includes subphthalocyanine or a subphthalocyanine derivative.

[4]

The photoelectric conversion element according to [2] or [3], in which the organic semiconductor material includes fullerene or a fullerene derivative.

[5]

The photoelectric conversion element according to any one of [1] to [4], in which the organic photoelectric conversion layer includes at least one of the ChDT1 derivative or the ChDT2 derivative; the subphthalocyanine or the subphthalocyanine derivative; and the fullerene or the fullerene derivative.

[6]

A solid-state imaging device including pixels each including one or a plurality of organic photoelectric conversion sections, the one or the plurality of organic photoelectric conversion sections each including a first electrode;

a second electrode disposed to be opposed to the first electrode; and an organic photoelectric conversion layer provided between the first electrode and the second electrode and including at least one of a Chryseno[1,2-b:8,7-b']dithiophene (ChDT1) derivative represented by the following general formula (1) or a Chryseno[1,2-b:7,8-b']dithiophene (ChDT2) derivative represented by the following general formula (2).

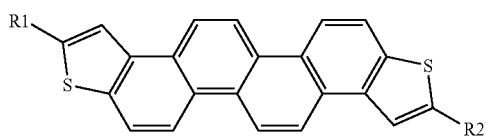

(1)

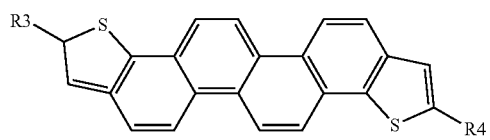

(2)

(R1 to R4 denote, each independently, a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof.)

[7]

The solid-state imaging device according to [6], in which, in each of the pixels, the one or the plurality of organic photoelectric conversion sections and one or a plurality of inorganic photoelectric conversion sections are stacked, the one or the plurality of inorganic photoelectric conversion sections performing photoelectric conversion in a wavelength region different from a wavelength region of the one or the plurality of organic photoelectric conversion sections.

[8]

The solid-state imaging device according to [7], in which the one or the plurality of inorganic photoelectric conversion sections are formed to be embedded in a semiconductor substrate, and the one or the plurality of organic photoelectric conversion sections are formed on side of a first surface of the semiconductor substrate. [9]

The solid-state imaging device according to [8], in which a multilayer wiring layer is formed on side of a second surface of the semiconductor substrate. [10]

The solid-state imaging device according to [8] or [9], in which the one or the plurality of organic photoelectric conversion sections perform photoelectric conversion of green light, and the one or the plurality of inorganic photoelectric conversion sections that perform photoelectric conversion of blue light and the one or the plurality of inorganic photoelectric conversion sections that perform photoelectric conversion of red light are stacked in the semiconductor substrate.

[11]

The solid-state imaging device according to any one of [6] to [10], in which, in each of the pixels, the plurality of organic photoelectric conversion sections that perform photoelectric conversion in mutually different wavelengths are stacked.

This application claims the benefit of Japanese Priority Patent Application JP2017-177775 filed with the Japan Patent Office on Sep. 15, 2017 and Japanese Priority Patent Application JP2018-081098 filed with the Japan Patent Office on Apr. 20, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
   a semiconductor substrate;
   a first electrode on the semiconductor substrate;
   a second electrode opposite to the first electrode; and
   an organic photoelectric conversion layer between the first electrode and the second electrode and including at least one of a Chryseno[1,2-b:8,7-b']dithiophene (ChDT1) derivative represented by the following general formula (1) or a Chryseno[1,2-b:7,8-b']dithiophene (ChDT2) derivative represented by the following general formula (2)

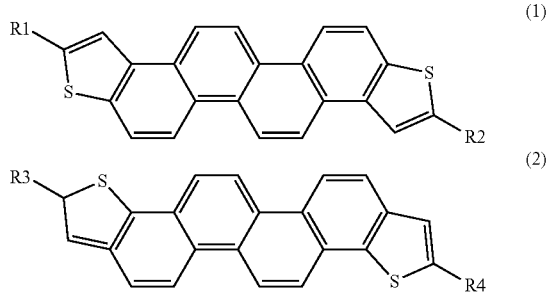

wherein R1 to R4 denote, each independently, one of a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof, and
   a molecular structure of a mother skeleton of the at least one of the ChDT1 derivative or the ChDT2 derivative is oriented in a horizontal direction with respect to the semiconductor substrate.

2. The photoelectric conversion element according to claim 1, wherein the organic photoelectric conversion layer further includes an organic semiconductor material having a maximum absorption wavelength longer than 450 nm.

3. The photoelectric conversion element according to claim 2, wherein the organic semiconductor material comprises one of subphthalocyanine or a subphthalocyanine derivative.

4. The photoelectric conversion element according to claim 2, wherein the organic semiconductor material comprises one of fullerene or a fullerene derivative.

5. The photoelectric conversion element according to claim 1, wherein the organic photoelectric conversion layer includes at least one of the ChDT1 derivative or the ChDT2 derivative; subphthalocyanine or a subphthalocyanine derivative; or fullerene or a fullerene derivative.

6. A solid-state imaging device, comprising:
   a semiconductor substrate; and
   a plurality of pixels, wherein
      each of the plurality of pixels includes at least one organic photoelectric conversion section on the semiconductor substrate, and
      the at least one organic photoelectric conversion section includes:
         a first electrode;
         a second electrode opposite to the first electrode; and
         an organic photoelectric conversion layer between the first electrode and the second electrode and including at least one of a Chryseno[1,2-b:8,7-b'] dithiophene (ChDT1) derivative represented by the following general formula (1) or a Chryseno [1,2-b:7,8-b']dithiophene (ChDT2) derivative represented by the following general formula (2)

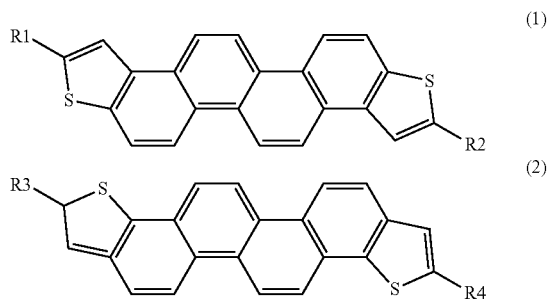

wherein R1 to R4 denote, each independently, one of a hydrogen atom, a halogen atom, an aromatic hydrocarbon group having 6 to 60 carbon atoms, an aromatic heterocyclic group having 3 to 30 carbon atoms, a haloalkyl group having 1 to 30 carbon atoms, an alkylamino group having 1 to 30 carbon atoms, a dialkylamino group having 2 to 60 carbon atoms, an alkyl sulfonyl group having 1 to 30 carbon atoms, a haloalkyl sulfonyl group having 1 to 3 carbon atoms, an alkylsilyl group having 3 to 30 carbon atoms, an alkylsilylacetylene group having 5 to 60 carbon atoms, a cyano group, or a derivative thereof, and
   a molecular structure of a mother skeleton of the at least one of the ChDT1 derivative or the ChDT2 derivative is oriented in a horizontal direction with respect to the semiconductor substrate.

7. The solid-state imaging device according to claim 6, wherein
   in each of the plurality of pixels, the at least one organic photoelectric conversion section and a first inorganic photoelectric conversion section are stacked, and
   the first inorganic photoelectric conversion section is configured to perform photoelectric conversion in a wavelength region different from a wavelength region of the at least one organic photoelectric conversion section.

8. The solid-state imaging device according to claim 7, wherein
   the semiconductor substrate includes the first inorganic photoelectric conversion section, and
   the at least one organic photoelectric conversion section is on a side of a first surface of the semiconductor substrate.

9. The solid-state imaging device according to claim 8, further comprising a multilayer wiring layer on a side of a second surface of the semiconductor substrate.

10. The solid-state imaging device according to claim 8, wherein the at least one organic photoelectric conversion section is configured to perform photoelectric conversion of green light, and the first inorganic photoelectric conversion section configured to perform photoelectric conversion of blue light and a second inorganic photoelectric conversion section configured to perform photoelectric conversion of red light are stacked in the semiconductor substrate.

11. The solid-state imaging device according to claim 6, wherein the at least one organic photoelectric conversion section corresponds to a plurality of organic photoelectric conversion sections, and in each of the plurality of pixels, the plurality of organic photoelectric conversion sections configured to perform photoelectric conversion in mutually different wavelengths are stacked.

* * * * *